(12) United States Patent
Yoo et al.

(10) Patent No.: US 12,446,369 B2
(45) Date of Patent: Oct. 14, 2025

(54) DISPLAY DEVICE

(71) Applicant: Samsung Display Co., LTD., Yongin-si (KR)

(72) Inventors: Je Won Yoo, Bucheon-si (KR); In Hyuk Kim, Hwaseong-si (KR); Jong Won Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 745 days.

(21) Appl. No.: 17/529,821

(22) Filed: Nov. 18, 2021

(65) Prior Publication Data

US 2022/0209069 A1  Jun. 30, 2022

(30) Foreign Application Priority Data

Dec. 30, 2020  (KR) .................. 10-2020-0188548

(51) Int. Cl.
*H10H 20/831* (2025.01)
*H10H 20/857* (2025.01)
*H10H 29/14* (2025.01)

(52) U.S. Cl.
CPC ...... *H10H 20/8312* (2025.01); *H10H 20/857* (2025.01); *H10H 29/142* (2025.01)

(58) Field of Classification Search
CPC ................................................. H01L 33/382
See application file for complete search history.

(56) References Cited

U.S. PATENT DOCUMENTS 9,349,920 B2  5/2016 Na et al.
10,128,412 B2  11/2018 Na et al.
12,324,312 B2  6/2025 Kim et al.
2008/0284690 A1  11/2008 Ko et al.
2016/0233384 A1*  8/2016 Na .................. H10H 20/8312
2021/0225280 A1*  7/2021 Li .......................... G09G 3/3275
2021/0384177 A1*  12/2021 Liu ......................... H01L 25/167

FOREIGN PATENT DOCUMENTS

KR  10-2013-0074471 A  7/2013
KR     10-1436123     11/2014
KR  10-2020-0034896 A  4/2020
KR     10-2020-0088951  7/2020

OTHER PUBLICATIONS

Korean Office Action, issued in corresponding to Korean Application No. 10-2020-0188548, dated Aug. 1, 2025, 7 pages.

* cited by examiner

*Primary Examiner* — Ajay Ojha
*Assistant Examiner* — Hajar Kolahdouzan
(74) *Attorney, Agent, or Firm* — Womble Bond Dickinson (US) LLP

(57) ABSTRACT

A display device comprises a first electrode disposed on a substrate, a second electrode disposed on the substrate and spaced apart from the first electrode, light emitting elements having ends disposed on the first electrode and the second electrode, a third electrode disposed on the substrate, and a fourth electrode disposed on the substrate and spaced apart from the third electrode, and semiconductor elements having ends disposed on the third electrode and the fourth electrode, wherein the light emitting elements each include a first semiconductor layer, a second semiconductor layer, and a light emitting layer disposed between the first semiconductor layer and the second semiconductor layer, and the semiconductor elements and the first semiconductor layer of the light emitting elements includes a same material.

15 Claims, 14 Drawing Sheets

DISPLAY DEVICE

CROSS-REFERENCE TO RELATED APPLICATION(S)

This application claims priority to and benefits of Korean Patent Application No. 10-2020-0188548 under 35 U.S.C. 119, filed on Dec. 30, 2020 in the Korean Intellectual Property Office (KIPO), the entire contents of which are hereby incorporated by reference.

BACKGROUND

1. Technical Field

The disclosure relates to a display device.

2. Description of the Related Art

The importance of display devices has steadily increased with the development of multimedia technology. In response thereto, various types of display devices such as an organic light emitting display (OLED), a liquid crystal display (LCD) and the like are in use.

A display device may be a device for displaying an image, and may include a display panel, such as an OLED panel or an LCD panel. Light emitting display panels may include light emitting elements, e.g., light emitting diodes (LEDs), and examples of the light emitting diode include an organic light emitting diode using an organic material as a light emitting material and an inorganic light emitting diode using an inorganic material as a light emitting material.

SUMMARY

Aspects of the disclosure may provide a display device including a light emitting element array having light emitting elements to emit light, and a semiconductor element array capable of providing power to the light emitting element array.

However, aspects of the disclosure are not restricted. The above and other aspects of the disclosure will become more apparent to one of ordinary skill in the art to which the disclosure pertains by referencing the detailed description of the disclosure given below.

A display device according to an embodiment may include a semiconductor element array including semiconductor elements having piezoelectric properties, and may additionally generate power required during the operation of the display device. The semiconductor element array may provide a power source required for the light emitting element to emit light in the light emitting element array, and the display device may have an advantage of reducing power consumed in a power supply device.

It should be noted that the effects of the disclosure are not limited to those described above, and other effects of the disclosure will be apparent from the following description.

According to an embodiment of the disclosure, a display device may include a first electrode disposed on a substrate, a second electrode disposed on the substrate and spaced apart from the first electrode, light emitting elements having ends disposed on the first electrode and the second electrode, a third electrode disposed on the substrate, a fourth electrode disposed on the substrate and spaced apart from the third electrode, and semiconductor elements having ends disposed on the third electrode and the fourth electrode, wherein the light emitting elements each include a first semiconductor layer, a second semiconductor layer, and a light emitting layer disposed between the first semiconductor layer and the second semiconductor layer, and the semiconductor elements and the first semiconductor layer of the light emitting elements include a same material.

The display device may further include a first connection electrode disposed on the first electrode and in contact with an end of each of the light emitting elements, a second connection electrode disposed on the second electrode and in contact with another end of each of the light emitting elements, a third connection electrode disposed on the third electrode and in contact with an end of each of the semiconductor elements, and a fourth connection electrode disposed on the fourth electrode and in contact with another end of each of the semiconductor elements.

The third connection electrode may form a Schottky contact with each of the semiconductor elements, and the fourth connection electrode may form an ohmic contact with each of the semiconductor elements.

Each of the first connection electrode and the second connection electrode may form an ohmic contact with each of the light emitting elements.

The display device may further include a via layer disposed between the substrate and the electrodes, and voltage wires disposed between the via layer and the substrate, wherein the voltage wires may include a first voltage wire electrically connected to the first electrode, a second voltage wire electrically connected to the second electrode, a third voltage wire electrically connected to the third electrode, and a fourth voltage wire electrically connected to the fourth electrode.

The fourth voltage wire may be electrically connected to the first voltage wire.

The first electrode may be electrically connected to the first voltage wire through a first transistor disposed between the via layer and the substrate, and the second electrode may contact the second voltage wire through a contact hole penetrating the via layer.

The third electrode may contact the third voltage wire through a contact hole penetrating the via layer, and the fourth electrode may contact the fourth voltage wire through a contact hole penetrating the via layer.

The third electrode may contact the third voltage wire through a contact hole penetrating the via layer, and the fourth electrode may be electrically connected to the fourth voltage wire through a first capacitor and a second transistor electrically connected to the first capacitor.

The fourth voltage wire may be electrically connected to a power storage device electrically connected to the first voltage wire.

The display device may further include a bank surrounding a region where the first electrode and the second electrode may be disposed, and a region where the third electrode and the fourth electrode may be disposed.

The display device may further include protruding patterns disposed between the substrate and the first electrode, and between the substrate and the second electrode.

Each of the first electrode and the second electrode may extend in a first direction, each of the third electrode and the fourth electrode may extend in the first direction, and among regions surrounded by the bank, the region where the first electrode and the second electrode may be disposed may be spaced apart in a second direction intersecting the first direction from the region where the third electrode and the fourth electrode may be disposed.

Each of the first electrode and the second electrode may extend in a second direction, each of the third electrode and the fourth electrode may extend in the second direction, and the region where the first electrode and the second electrode may be disposed may be spaced apart in the second direction from the region where the third electrode and the fourth electrode may be disposed.

The first electrode and the third electrode may be disposed parallel to each other in the second direction, and the second electrode and the fourth electrode may be disposed parallel to each other in the second direction.

According to an embodiment of the disclosure, a display device may include a display area and a non-display area surrounding the display area, sub-pixels disposed in the display area and disposed in a first direction and in a second direction intersecting the first direction, each of the sub-pixel including a first electrode, a second electrode spaced apart from the first electrode, and light emitting elements disposed on the first electrode and the second electrode, and a semiconductor element array disposed in the non-display area, the semiconductor element array including a third electrode, a fourth electrode spaced apart from the third electrode, and semiconductor elements disposed on the third electrode and the fourth electrode, wherein the semiconductor element array may be disposed in the non-display area on sides of the display area in the second direction.

The light emitting elements may each include a first semiconductor layer, a second semiconductor layer, and a light emitting layer disposed between the first semiconductor layer and the second semiconductor layer, and the semiconductor elements and the first semiconductor layer of the light emitting elements may include a same material.

The display device may further include a first connection electrode disposed on the first electrode and in contact with an end of each of the light emitting elements, a second connection electrode disposed on the second electrode and in contact with another end of each of the light emitting elements, a third connection electrode disposed on the third electrode and in contact with an end of each of the semiconductor elements, and a fourth connection electrode disposed on the fourth electrode and in contact with another end of each of the semiconductor elements.

Each of the first connection electrode and the second connection electrode may form an ohmic contact with each of the light emitting elements, the third connection electrode may form a Schottky contact with each of the semiconductor elements, and the fourth connection electrode may form an ohmic contact with each of the semiconductor elements.

The first electrode, the second electrode, the third electrode, and the fourth electrode may be disposed on a same layer.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
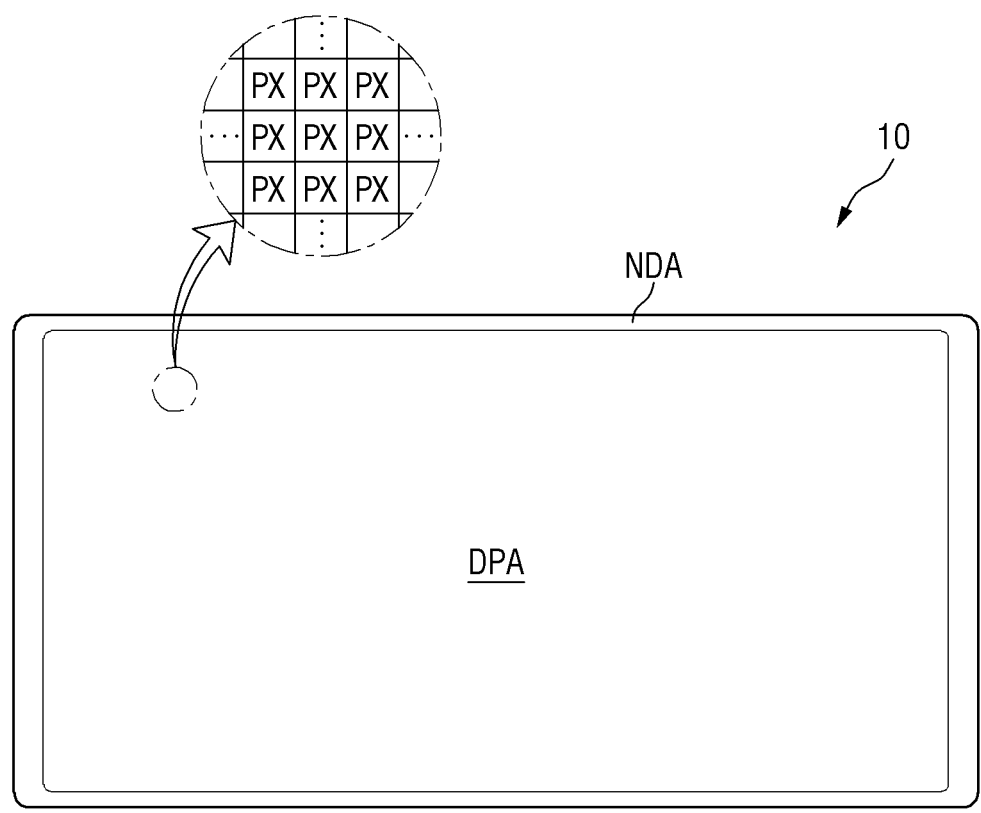
FIG. 1 is a schematic plan view illustrating a display device according to an embodiment.
Figure 1:
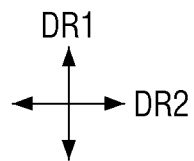

The disclosure will now be more fully made hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well (and vice versa), unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that the terms "connected to" or "coupled to" may include a physical or electrical connection or coupling.

It will also be understood that when a layer is referred to as being "on" another layer or substrate, it can be directly on the other layer or substrate, or intervening layers may also be present.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, extending under, covering, or partly covering or any other suitable term as would be appreciated and understood by those of ordinary skill in the art.

Unless otherwise defined or implied, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view illustrating a display device according to an embodiment.

Referring to FIG. 1, a display device 10 may display a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which may provide a display screen.

The display device 10 may include a display panel which may provide a display screen. Examples of the display panel may include an inorganic light emitting diode display panel, an organic light emitting display panel, a quantum dot light emitting display panel, a plasma display panel and a field emission display panel. In the following description, a case where an inorganic light emitting diode display panel may be applied as a display panel will be shown, but the disclosure is not limited thereto, and other display panels may be applied.

The shape of the display device 10 may be variously modified. For example, the display device 10 may have a shape such as a rectangular shape elongated in a horizontal direction, a rectangular shape elongated in a vertical direction, a square shape, a quadrilateral shape with rounded corners (vertices), another polygonal shape, and a circular shape. The shape of a display area DPA of the display device 10 may also be similar to the overall shape of the display device 10. FIG. 1 illustrates the display device 10 having a rectangular shape elongated in a second direction DR2.

The display device 10 may include the display area DPA and a non-display area NDA. The display area DPA may be an area where a screen can be displayed, and the non-display area NDA may be an area where a screen may not be displayed. The display area DPA may also be referred to as an active region, and the non-display area NDA may also be referred to as a non-active region. The display area DPA may substantially occupy the center of the display device 10.

The display area DPA may include pixels PX. The pixels PX may be arranged in a matrix. The shape of each pixel PX may be a rectangular or square shape in plan view. However, the disclosure is not limited thereto, and it may be a rhombic shape in which each side may be inclined with respect to one direction. The pixels PX may be disposed in a stripe arrangement or a PenTile® arrangement. Each of the pixels PX may include one or more light emitting elements that emit light of a specific wavelength band to display a specific color.

The non-display area NDA may be disposed around the display area DPA. The non-display area NDA may completely or partially surround the display area DPA. The display area DPA may have a rectangular shape, and the non-display area NDA may be disposed adjacent to four sides of the display area DPA. The non-display area NDA may form a bezel of the display device 10. Wires or circuit drivers that may be included in the display device 10 may be disposed in the non-display area NDA, or external devices may be mounted thereon.

Figure 2:
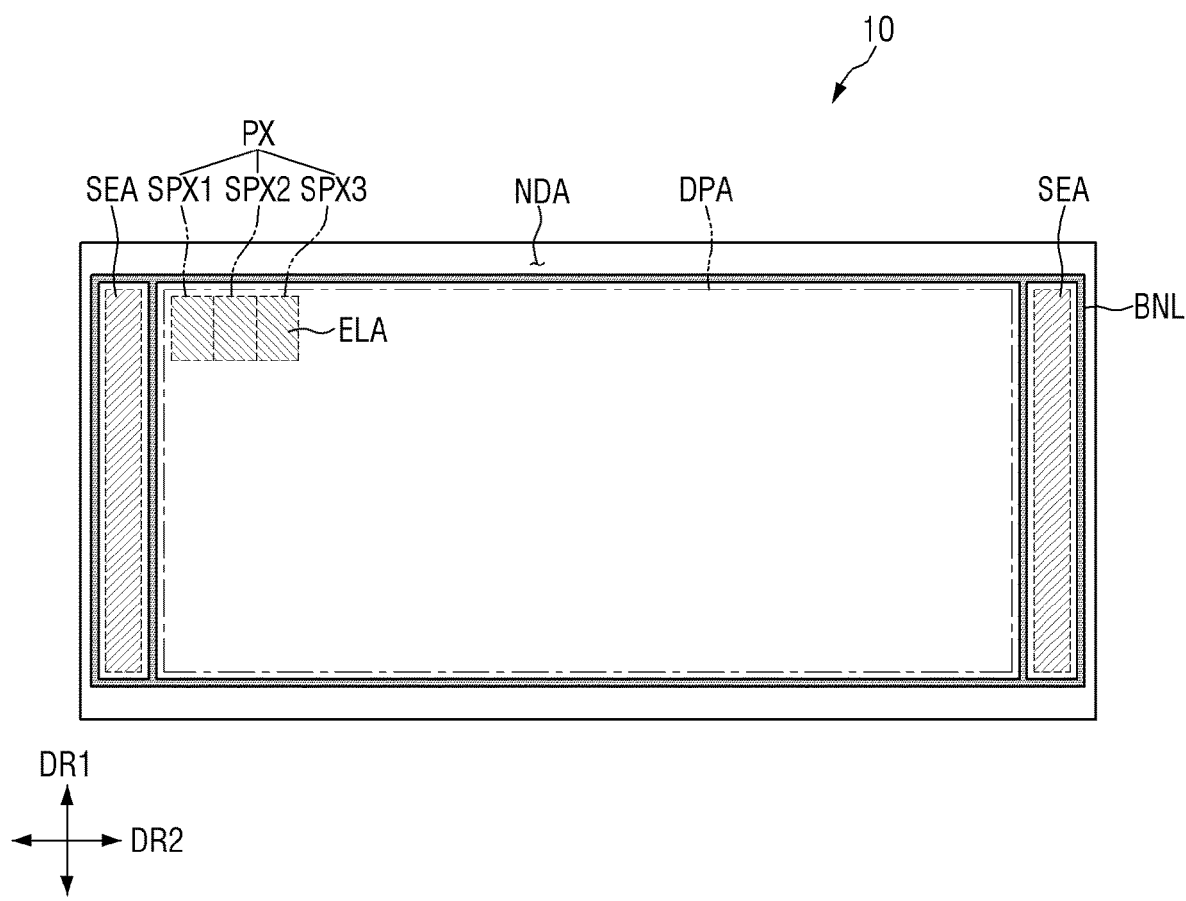
FIG. 2 is a schematic view illustrating a display area and a non-display area of a display device according to an embodiment.

FIG. 2 is a schematic view illustrating a display area and a non-display area of a display device according to an embodiment.

Referring to FIG. 2, the display device 10 according to an embodiment may include light emitting element arrays ELA provided in the display area DPA and a semiconductor element array SEA provided in the non-display area NDA. Multiple pixels PX arranged in a first direction DR1 and a second direction DR2 may be disposed in the display area DPA of the display device 10, and a pixel PX may include multiple sub-pixels SPXn that may be arranged in a direction. The sub-pixels SPXn may be arranged in the first direction DR1 and the second direction DR2 in the display area DPA, and certain of the pixels may constitute a pixel PX.

Each of the sub-pixels SPXn may include the light emitting element array ELA including a light emitting element ED (see FIG. 3) and an electrode connected to the light emitting element ED. The light emitting element array ELA may be electrically connected to conductive layers thereunder and may receive an electric signal applied from the conductive layer to emit light from the light emitting element ED. The light emitting element array ELA may receive a power source from a power supply device included in the display device 10 to emit light.

A region surrounded by a bank BNL may be defined in a part of the non-display area NDA, and the semiconductor element array SEA may be disposed in the region. As one example, the semiconductor element array SEA may be disposed on sides in the second direction DR2 of the display area DPA. However, the disclosure is not limited thereto, and the semiconductor element array SEA may be disposed in another region of the non-display area NDA, or may be disposed in larger number.

According to an embodiment, the semiconductor element array SEA may include a semiconductor element SE (see FIG. 4) capable of generating power in a specific state, and an electrode connected to the semiconductor element SE. The semiconductor element array SEA may be electrically connected to the light emitting element array ELA through a conductive layer thereunder, and may provide power generated in the semiconductor element SE to the light emitting element array ELA. The semiconductor element array SEA may supplement power required for the light emitting element ED to emit light in the light emitting element array ELA. The display device 10 may have an advantage of reducing power consumed in case that the light emitting element ED emits light, by including the semiconductor element array SEA capable of generating power by itself, in addition to the power supply device that provides power used for light emission of the light emitting element ED.

Hereinafter, a structure of the semiconductor element array SEA and one pixel PX included in the light emitting element array ELA in the display device 10 according to an embodiment will be described in detail with further reference to other drawings.

Figure 3:
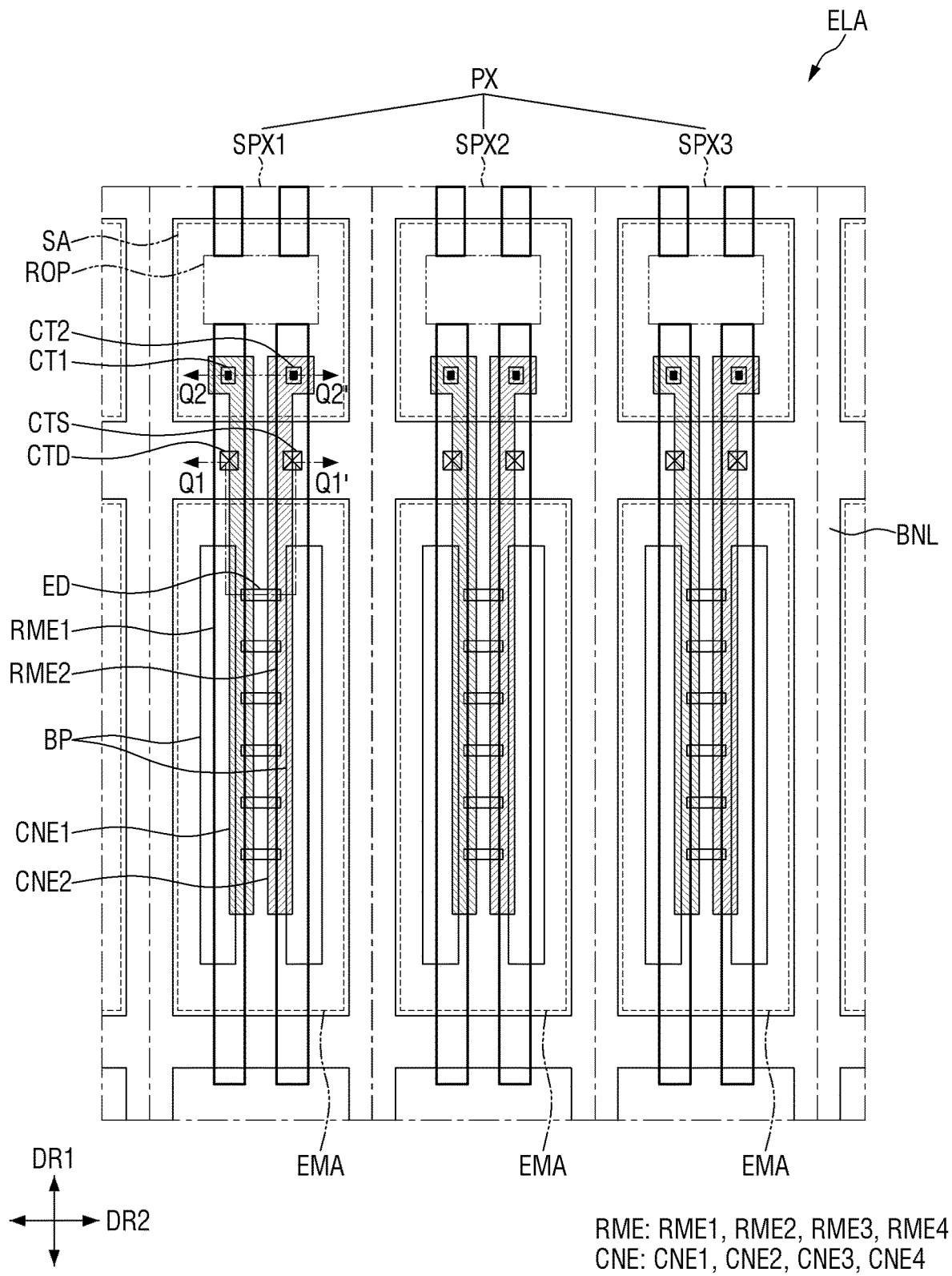
FIG. 3 is a schematic plan view showing a pixel included in a display device according to an embodiment.
Figure 4:
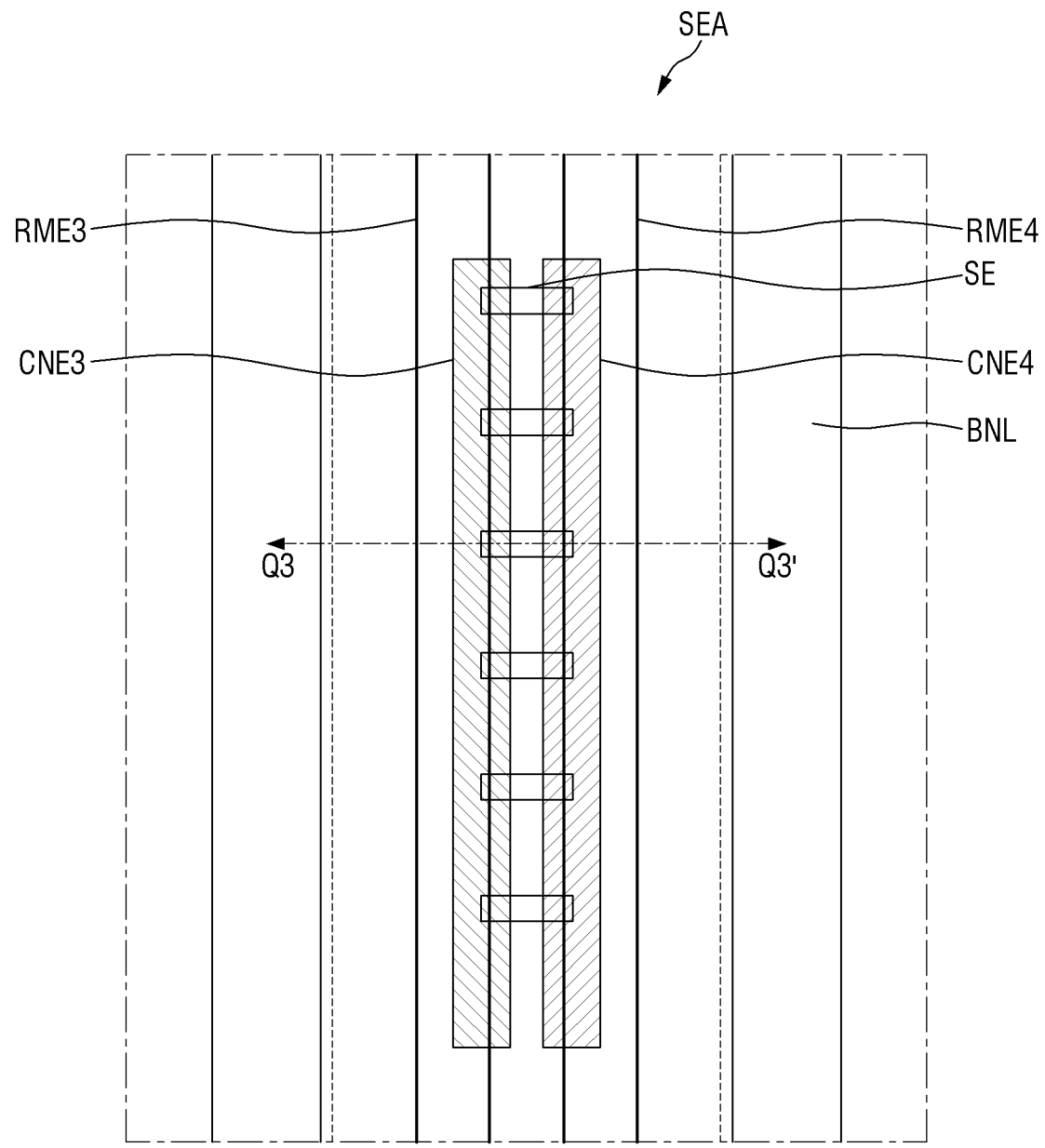
FIG. 4 is a schematic plan view showing a semiconductor element array included in a display device according to an embodiment.
Figure 5:
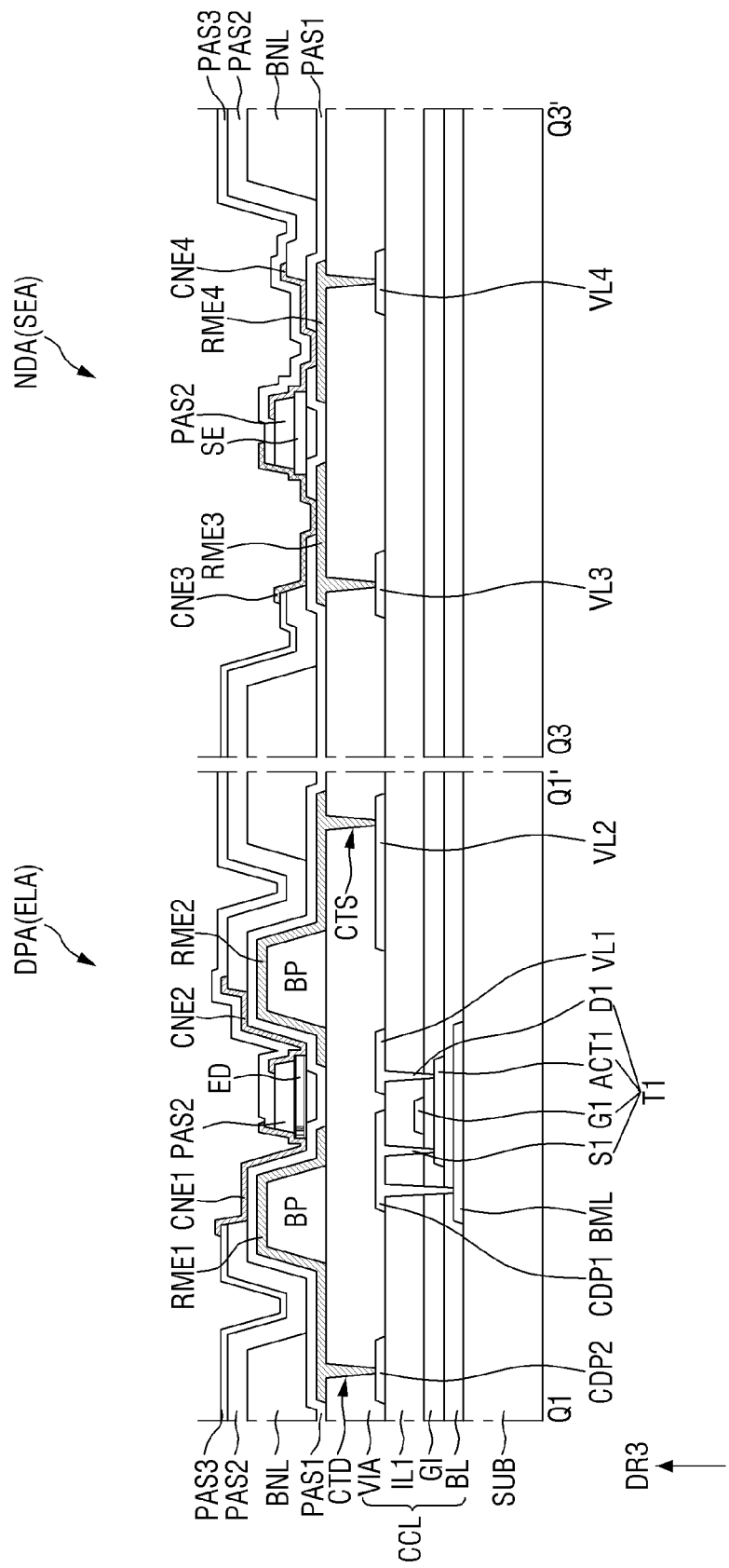
FIG. 5 is a schematic cross-sectional view taken along line Q1-Q1' of FIG. 3 and line Q3-Q3' of FIG. 4.
Figure 6:
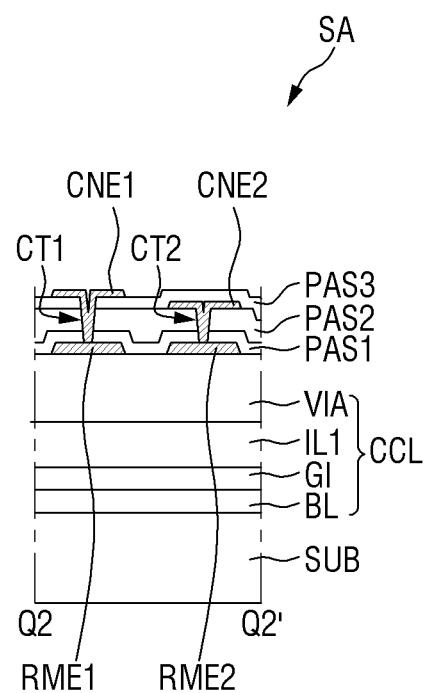
FIG. 6 is a schematic cross-sectional view taken along line Q2-Q2' of FIG. 3.

FIG. 3 is a schematic plan view showing a pixel included in a display device according to an embodiment. FIG. 4 is a schematic plan view showing a semiconductor element array included in a display device according to an embodiment. FIG. 5 is a schematic cross-sectional view taken along line Q1-Q1' of FIG. 3 and line Q3-Q3' of FIG. 4. FIG. 6 is a schematic cross-sectional view taken along line Q2-Q2' of FIG. 3. FIG. 5 illustrates a cross section across ends of the light emitting element ED and the semiconductor element SE included in the light emitting element array ELA and the semiconductor element array SEA. FIG. 6 illustrates a cross section across contact portions CT1 and CT2 disposed in one sub-pixel SPXn.

Referring to FIGS. 3 to 6, each of the pixels PX of the display device 10 may include sub-pixels SPXn (n ranging, for example, from 1 to 3). For example, one pixel PX may include a first sub-pixel SPX1, a second sub-pixel SPX2 and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the disclosure is not limited thereto, and the sub-pixels SPXn may emit light of the same color. In an embodiment, each of the sub-pixels SPXn may emit blue light. Although FIG. 3 illustrates that one pixel PX includes three sub-pixels SPXn, the disclosure is not limited thereto, and the pixel PX may include a larger number of sub-pixels SPXn.

Each sub-pixel SPXn of the display device 10 may include an emission area EMA and a non-emission area. The emission area EMA may be an area where the light emitting elements ED may be aligned to emit light of a certain wavelength band. The non-emission area may be an area where there may be no light emitting element ED and the light emitted from the light emitting elements ED may not reach, so that no light may be emitted. The emission area may include an area in which the light emitting element ED may be disposed, and an area adjacent to the light emitting element ED to emit light emitted from the light emitting element ED.

Without being limited thereto, the emission area EMA may also include an area in which light emitted from the light emitting element ED may be reflected or refracted by another member and emitted. The light emitting elements ED may be disposed in each sub-pixel SPXn, and the emission area may be formed to include an area where the light emitting elements ED may be disposed and an area adjacent thereto.

Although it is shown in the drawing that the sub-pixels SPXn have the emission areas EMA that may be substantially identical in size, the disclosure is not limited thereto. In some embodiments, the emission areas EMA of the sub-pixels SPXn may have different sizes according to a color or wavelength band of light emitted from the light emitting element ED disposed in each sub-pixel.

Each sub-pixel SPXn may further include a sub-region SA disposed in the non-emission area. The sub-region SA may be disposed at one side of the emission area EMA in the first direction DR1, and may be disposed between the emission areas EMA of the sub-pixels SPXn adjacent in the first direction DR1. For example, the emission areas EMA and the sub-regions SA may be repeatedly arranged in the second direction DR2, respectively, while being alternately arranged in the first direction DR1. However, the disclosure is not limited thereto, and the emission areas EMA and the sub-regions SA in the pixels PX may have an arrangement different from that of FIG. 3.

A bank BNL may be disposed between the sub-regions SA and between the emission areas EMA, and the distance therebetween may vary with the width of the bank BNL. Light may not be emitted from the sub-region SA because the light emitting element ED may not be disposed in the sub-region SA, but an electrode RME disposed in each sub-pixel SPXn may be partially disposed in the sub-region SA. The electrodes RME disposed in different sub-pixels SPXn may be disposed to be separated by a separation portion ROP of the sub-region SA.

The bank BNL may include portions extending in the first direction DR1 and the second direction DR2 in plan view to be arranged in a grid pattern over the surface (e.g., entire surface) of the display area DPA. The bank BNL may be disposed along the boundaries between the sub-pixels SPXn to delimit the neighboring sub-pixels SPXn. Further, the bank BNL may be disposed so as to surround the emission area EMA disposed for each sub-pixel SPXn to distinguish the emission areas EMA. Furthermore, the bank BNL may be disposed so as to surround a region in which the semiconductor element array SEA may be disposed in the non-display area NDA.

The display device 10 may include a first substrate SUB, an active layer disposed on the first substrate SUB, conductive layers, and insulating layers. The semiconductor layer, the conductive layers, and the insulating layers may each constitute a circuit layer CCL and a display element layer of the display device 10.

The first substrate SUB may be an insulating substrate. The first substrate SUB may be made of an insulating material such as glass, quartz, polymer resin, or a combination thereof. Further, the first substrate SUB may be a rigid substrate, but may also be a flexible substrate which can be bent, folded or rolled.

A first conductive layer may be disposed on the first substrate SUB. The first conductive layer may include a lower metal layer BML that may be disposed to overlap an active layer ACT1 of a first transistor T1. The lower metal layer BML may include a material that blocks light to prevent light from reaching the active layer ACT1 of the first transistor T1. However, the lower metal layer BML may be omitted.

The buffer layer BL may be disposed on the lower metal layer BML and the first substrate SUB. The buffer layer BL may be formed on the first substrate SUB to protect the transistors of the pixel PX from moisture permeating through the first substrate SUB susceptible to moisture permeation, and may perform a surface planarization function.

The active layer may be disposed on the buffer layer BL. The active layer may include a first active layer ACT1 of the first transistor T1. The first active layer ACT1 of the first transistor T1 may be disposed to partially overlap a first gate electrode G1 of a second conductive layer to be described later.

The active layer may include polycrystalline silicon, monocrystalline silicon, oxide semiconductor, and the like, or a combination thereof. In another embodiment, the active layer may include polycrystalline silicon. The oxide semiconductor may be an oxide semiconductor including indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

In the drawing, it is illustrated that one first transistor T1 may be disposed in the sub-pixel SPXn of the display device 10, but the disclosure is not limited thereto, and the display device 10 may include a larger number of transistors.

The first gate insulating layer GI may be disposed on the active layer and the buffer layer BL. The first gate insulating layer GI may serve as a gate insulating layer of the first transistor T1.

The second conductive layer may be disposed on the first gate insulating layer GI. The second conductive layer may include the first gate electrode G1 of the first transistor T1. The first gate electrode G1 may be arranged to overlap a channel region of the first active layer ACT1 in a third direction DR3 which may be a thickness direction.

A first interlayer insulating layer IL1 may be disposed on the second conductive layer. The first interlayer insulating layer IL1 may function as an insulating layer between the second conductive layer and other layers disposed thereon, and may protect the second conductive layer.

A third conductive layer may be disposed on the first interlayer insulating layer ILL The third conductive layer may include voltage wires VL1, VL2, VL3, and VL4, and electrode patterns CDP1 and CDP2.

A first voltage wire VL1 and a second voltage wire VL2 may each be disposed in the display area DPA and connected to the light emitting element array ELA of each sub-pixel SPXn. The first voltage wire VL1 may be applied with a high potential voltage (or a first power voltage) transmitted to a first electrode RME1, and the second voltage wire VL2 may be applied with a low potential voltage (or a second power voltage) transmitted to a second electrode RME2. A part of the first voltage wire VL1 may be in contact with the first active layer ACT1 of the first transistor T1 through a contact hole penetrating the first interlayer insulating layer IL1 and the first gate insulating layer GI. The first voltage wire VL1 may serve as a first drain electrode D1 of the first transistor T1.

In some embodiments, each of the first voltage wires VL1 may be applied with the first power voltage, and the first transistor T1 may be connected to the first voltage wire VL1. The first voltage wire VL1 may serve as the first drain electrode D1 of the first transistor T1.

A third voltage wire VL3 and a fourth voltage wire VL4 may each be disposed in the non-display area NDA and connected to the semiconductor element array SEA. The third voltage wire VL3 may be electrically connected to a third electrode RME3, and the fourth voltage wire VL4 may be electrically connected to a fourth electrode RME4. According to an embodiment, any one of the third voltage wire VL3 and the fourth voltage wire VL4 may transmit a current generated in the semiconductor element SE to the first voltage wire VL1 disposed in the display area DPA. As one example, any one of the third voltage wire VL3 and the fourth voltage wire VL4 may be electrically connected to the first voltage wire VL1.

The semiconductor element array SEA of the display device 10 may generate a current required in case that the light emitting element ED of the light emitting element array ELA emits light. The current generated in the semiconductor element SE may be transmitted to either the third electrode RME3 or the fourth electrode RME4 through a connection electrode CNE, and may be transmitted to a voltage wire connected to the first voltage wire VL1 through an electrode. The display device 10 may include voltage wires through which a current generated in the semiconductor element array SEA may be transmitted to the light emitting element array ELA. A description thereof will be given later.

Although not illustrated in the drawings, the voltage wires VL1, VL2, VL3, and VL4 may have a shape extending in the first direction DR1 in the display area DPA and the non-display area NDA. Each of the voltage wires VL1, VL2, VL3, and VL4 may further include a portion extending in the second direction DR2 in the display area DPA and the non-display area NDA, and the same voltage wires may each include a portion extending in the second direction DR2 to be connected to each other. Each of the voltage wires VL1, VL2, VL3, and VL4 may be disposed in a mesh structure over the surface (e.g., entire surface) of the display device 10.

A first electrode pattern CDP1 may be in contact with the first active layer ACT1 of the first transistor T1 through a contact hole penetrating the first interlayer insulating layer IL1 and the first gate insulating layer GI. The first electrode pattern CDP1 may be in contact with the lower metal layer BML, through another contact hole. The first electrode pattern CDP1 may serve as a first source electrode S1 of the first transistor T1.

A second electrode pattern CDP2 may be electrically connected to the first transistor T1 through the first electrode pattern CDP1. In the drawing, it is illustrated that the first electrode pattern CDP1 and the second electrode pattern CDP2 may be arranged to be spaced apart from each other, but the first electrode pattern CDP1 and the second electrode pattern CDP2 may be connected to each other directly or through a pattern of a different layer. In some embodiments, the second electrode pattern CDP2 may be integrated with the first electrode pattern CDP1 to form a single pattern. The second electrode pattern CDP2 may also be connected to the first electrode RME1, and the first transistor T1 may transmit a first power voltage applied from the first voltage wire VL1 to the first electrode RME1.

In the drawings, it is illustrated that the first electrode pattern CDP1 and the second electrode pattern CDP2 may be formed on the same layer, but the disclosure is not limited thereto. In some embodiments, the second electrode pattern CDP2 may be formed in, e.g., a fourth conductive layer, which may be a different conductive layer from that of the first electrode pattern CDP1, disposed above the third conductive layer with some insulating layers interposed therebetween. The voltage wires VL1, VL2, VL3, and VL4 may also be formed in the fourth conductive layer instead of the third conductive layer, and the first voltage wire VL1 may be electrically connected to the first drain electrode D1 of the first transistor T1 through a different conductive pattern. Further, although not shown in the drawings, each of the second conductive layer and the third conductive layer may further include a capacitance electrode of a storage capacitor. The capacitance electrodes of the storage capacitor may be disposed on different layers to form a capacitor with the first interlayer insulating layer IL1 therebetween. In some embodiments, the capacitance electrodes of the storage capacitor may be formed integrally with the first gate electrode G1 and the source electrode S1 of the first transistor T1, respectively. However, the disclosure is not limited thereto.

The buffer layer BL, the first gate insulating layer GI, and the first interlayer insulating layer IL1 described above may be formed of multiple inorganic layers stacked in an alternating manner. For example, the buffer layer BL, the first gate insulating layer GI, and the first interlayer insulating layer IL1 may be formed as a double layer formed by stacking, or a multilayer formed by alternately stacking, inorganic layers including at least one of silicon oxide (SiOx), silicon nitride (SiNx), and silicon oxynitride (SiOxNy). However, the disclosure is not limited thereto, and the buffer layer BL, the first gate insulating layer GI, and the first interlayer insulating layer IL1 may be formed as a single inorganic layer including the above-described insulating material. In some embodiments, the first interlayer insulating layer IL1 may be made of an organic insulating material such as polyimide (PI).

The second conductive layer and the third conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, the disclosure is not limited thereto.

The via layer VIA may be disposed on the third conductive layer. The via layer VIA may include an organic insulating material, for example, an organic insulating material such as polyimide (PI), to perform a surface planarization function.

The electrodes RME (RME1, RME2, RME3, and RME4), protruding patterns BP, the bank BNL, the light emitting elements ED, the semiconductor element SE, and connection electrodes CNE (CNE1, CNE2, CNE3, and CNE4) may be disposed on the via layer VIA. Further, insulating layers PAS1, PAS2, and PAS3 may be disposed on the via layer VIA.

The protruding patterns BP may be disposed (e.g., directly disposed) on the via layer VIA in the display area DPA. The protruding patterns BP may have a shape extending in the first direction DR1 and may be spaced apart from each other in the second direction DR2. For example, the protruding pattern BP may extend in the first direction DR1 in the emission area EMA of each sub-pixel SPXn, and may be disposed on both sides in the second direction DR2 with respect to the center of the emission area EMA. The protruding patterns BP may be spaced apart from each other in the second direction DR2, and the light emitting elements ED may be disposed therebetween.

The length of the protruding patterns BP extending in the first direction DR1 may be smaller than the length in the first direction DR1 of the emission area EMA surrounded by the bank BNL. The protruding patterns BP may be disposed in the emission area EMA of the sub-pixel SPXn over the surface (e.g., entire surface) of the display area DPA, and may form an isolated (e.g., island-shaped) pattern having a narrow width and extending in a direction.

The protruding pattern BP may have a structure in which at least a part thereof protrudes from the top surface of the via layer VIA. The protruding portion of the protruding pattern BP may have inclined side surfaces, and the light emitted from the light emitting element ED may be reflected by the electrode RME disposed on the protruding pattern BP and emitted in an upward direction from the via layer VIA. However, the disclosure is not limited thereto, and the protruding pattern BP may have a semicircular or semi-elliptical shape having a curved outer surface. The protruding pattern BP may include an organic insulating material such as polyimide (PI), but is not limited thereto.

Among the electrodes RME, the first electrode RME1 and the second electrode RME2 may be disposed in the display area DPA. The first electrode RME1 and the second electrode RME2 may have a shape extending in a direction and may be disposed for each sub-pixel SPXn. The first electrode RME1 and the second electrode RME2 may extend in the first direction DR1 to be disposed over at least the emission area EMA and the sub-region SA of the sub-pixel SPXn, and may be disposed to be spaced apart from each other in the second direction DR2.

The first electrode RME1 and the second electrode RME2 may be disposed to be spaced apart in the first direction DR1 in the emission area EMA, and may be partially disposed in the sub-region SA of the corresponding sub-pixel SPXn and another sub-pixel SPXn adjacent in the first direction DR1 over the bank BNL. The first electrode RME1 and the second electrode RME2 of different sub-pixels SPXn may be separated with respect to the separation portion ROP located in the sub-region SA of a sub-pixel SPXn.

The arrangement of the first electrode RME1 and the second electrode RME2 may be formed in such a way that the electrode may be formed as a single electrode line extending in the first direction DR1, the light emitting elements ED may be arranged, and in a subsequent process, the electrode line may be separated. The electrode line may be used to generate an electric field in the sub-pixel SPXn in order to align the light emitting elements ED during the fabricating process of the display device 10. After aligning the light emitting elements ED, the electrode line may be separated by the separation portion ROP to form the first electrode RME1 and the second electrode RME2 separated in the first direction DR1.

The first electrode RME1 and the second electrode RME2 may be disposed on different protruding patterns BP, respectively. The first electrode RME1 may be disposed on the left side from the center of the emission area EMA, and partially disposed on the protruding pattern BP disposed on the left side. The second electrode RME2 may be disposed on the right side from the center of the emission area EMA while being spaced apart from the first electrode RME1 in the second direction DR2. The second electrode RME2 may be partially disposed on the protruding pattern BP disposed on the right side.

The first electrode RME1 and the second electrode RME2 may be disposed at least on the inclined side surfaces of the protruding pattern BP. In an embodiment, the width of the electrodes RME measured in the second direction DR2 may be smaller than the width of the protruding pattern BP and the bank BNL measured in the second direction DR2. The first electrode RME1 and the second electrode RME2 may be disposed to cover at least one side surface of the protruding pattern BP to reflect light emitted from the light emitting element ED.

A distance between the first electrode RME1 and the second electrode RME2 spaced apart in the second direction DR2 may be smaller than a distance between the protruding patterns BP. At least a part of the first electrode RME1 and at least a part of the second electrode RME2 may be disposed (e.g., directly disposed) on the via layer VIA to be on the same plane.

The first electrode RME1 and the second electrode RME2 may be connected to the third conductive layer through a first electrode contact hole CTD and a second electrode contact hole CTS, respectively, which may be formed in portions overlapping the bank BNL. The first electrode RME1 may be in contact with the second electrode pattern CDP2 through the first electrode contact hole CTD penetrating the via layer VIA thereunder. The second electrode RME2 may be in contact with the second voltage wire VL2 through the second electrode contact hole CTS penetrating the via layer VIA thereunder. The first electrode RME1 may be electrically connected to the first transistor T1 through the second electrode pattern CDP2 and the first electrode pattern CDP1 to receive the first power voltage, and the second electrode RME2 may be electrically connected to the second voltage wire VL2 to receive the second power voltage.

The first electrode RME1 and the second electrode RME2 may be electrically connected to the light emitting element ED. The first electrode RME1 and the second electrode RME2 may be connected to the light emitting element ED through the connection electrodes CNE (CNE1 and CNE2) to be described later, and may transmit an electric signal applied from the conductive layer thereunder to the light emitting element ED.

Among the electrodes RME, the third electrode RME3 and the fourth electrode RME4 may be disposed in the non-display area NDA. Similarly to the first electrode RME1 and the second electrode RME2, the third electrode RME3 and the fourth electrode RME4 may extend in the first direction DR1 within a region surrounded by the bank BNL in the non-display area NDA and may be disposed to be spaced apart from each other in the second direction DR2.

The display area DPA may be surrounded by the bank BNL, each sub-pixel SPXn may be partitioned by the bank BNL, and the light emitting element array ELA may be disposed for each sub-pixel SPXn. In contrast, in the non-display area NDA, since a region surrounded by the bank BNL may not be divided into regions by the bank BNL, the semiconductor element array SEA disposed in the non-display area NDA may be formed as one array in the region surrounded by the bank BNL. Each of the third electrode RME3 and the fourth electrode RME4 may be disposed to extend in the first direction DR1 as one electrode. Unlike the display area DPA, since the protruding pattern BP may not be disposed in the non-display area NDA, the third electrode RME3 and the fourth electrode RME4 may each be disposed (e.g., directly disposed) on the via layer VIA.

The third electrode RME3 and the fourth electrode RME4 may be electrically connected to the third voltage wire VL3 and the fourth voltage wire VL4, respectively. For example, the third electrode RME3 may be in contact (e.g., direct contact) with the third voltage wire VL3 through a contact hole penetrating the via layer VIA, and the fourth electrode RME4 may also be in contact (e.g., direct contact) with the fourth voltage wire VL4 through a contact hole penetrating the via layer VIA. In an embodiment in which the fourth voltage wire VL4 may be connected to the first voltage wire VL1, the third voltage wire VL3 may have a different potential than the fourth voltage wire VL4 or may be grounded, and the current generated in the semiconductor element SE may flow only to the fourth voltage wire VL4 through the fourth electrode RME4. The fourth electrode RME4 may be connected (e.g., directly connected) to the fourth voltage wire VL4, but is not limited thereto. In some embodiments, the fourth electrode RME4 may be electrically connected to the fourth voltage wire VL4 through a capacitor and a transistor.

The third electrode RME3 and the fourth electrode RME4 may be electrically connected to the semiconductor element SE. The third electrode RME3 and the fourth electrode RME4 may be connected to the semiconductor element SE through the connection electrodes CNE (CNE3 and CNE4) to be described later, and may transmit the current generated from the semiconductor element SE to one of the voltage wires VL3 and VL4.

According to an embodiment, the electrodes RME included in the light emitting element array ELA and the semiconductor element array SEA may be disposed on substantially the same layer. The first electrode RME1 and the second electrode RME2 of the light emitting element array ELA may each be disposed on the protruding pattern BP and at least partially disposed (e.g., directly disposed) on the via layer VIA, and the third electrode RME3 and the fourth electrode RME4 of the semiconductor element array SEA may be disposed (e.g., directly disposed) on the via layer VIA. The electrodes RME may be formed in the same process to have a similar arrangement structure or contain the same material.

Each of the electrodes RME may include a conductive material having high reflectivity. For example, the electrode RME may include a metal such as silver (Ag), copper (Cu), or aluminum (Al) as a material having high reflectivity, or may be an alloy including aluminum (Al), nickel (Ni), lanthanum (La), and the like. The electrode RME may reflect light emitted from the light emitting element ED and traveling toward the side surface of the protruding pattern BP in the upward direction from each sub-pixel SPXn.

However, the disclosure is not limited thereto, and each electrode RME may further include a transparent conductive material. For example, each electrode RME may include a material such as ITO, IZO, ITZO, or a combination thereof. In some embodiments, each of the electrodes RME may have a structure in which at least one transparent conductive material and at least one metal layer having high reflectivity may be stacked on each other, or may be formed as one layer including them. For example, each electrode RME may have a stacked structure of ITO/Ag/ITO, ITO/Ag/IZO, ITO/Ag/ITZO/IZO, or the like.

A first insulating layer PAS1 may be disposed on the via layer VIA and the electrodes RME. The first insulating layer PAS1 may be disposed to cover (e.g., entirely cover) the electrodes RME to protect them and insulate them from each other. The first insulating layer PAS1 may prevent the light emitting element ED and the semiconductor element SE, which may be disposed thereon, from being damaged by direct contact with the electrode RME.

In an embodiment, the first insulating layer PAS1 may have stepped portions such that the top surface thereof may be partially depressed between the electrodes RME spaced apart in the second direction DR2. The light emitting element ED or the semiconductor element SE may be disposed on the top surface of the first insulating layer PAS1, where the stepped portions may be formed, and thus a space may remain between the light emitting element ED or the semiconductor element SE and the first insulating layer PAS1.

The first insulating layer PAS1 may include contact portions CT1 and CT2 that may expose a part of the top surface of each electrode RME. The contact portions CT1 and CT2 may penetrate the first insulating layer PAS1, and the connection electrodes CNE, which will be described later, may be in contact with the exposed electrodes RME through the contact portions CT1 and CT2.

The bank BNL may be disposed on the first insulating layer PAS1. The bank BNL may be disposed to surround the display area DPA and the non-display area NDA, by including a portion extending in the first direction DR1 and the second direction DR2 in plan view. The bank BNL may be disposed in a grid pattern in the display area DPA, and may be disposed across the boundary of each sub-pixel SPXn to distinguish the neighboring sub-pixels SPXn. The bank BNL may be disposed to surround the emission area EMA and the sub-region SA in the display area DPA, and the regions partitioned and opened by the bank BNL may be the emission area EMA and the sub-region SA.

The bank BNL may have a certain height, and in some embodiments, the height of the top surface of the bank BNL may be higher than that of the protruding pattern BP, and the thickness of the bank BNL may be equal to or greater than that of the protruding pattern BP. The bank BNL may prevent ink from overflowing to the adjacent sub-pixel SPXn in an inkjet printing step during the fabricating process of the display device 10. The bank BNL may prevent inks in which different light emitting elements ED may be dispersed for different sub-pixels SPXn in the display area DPA from being mixed with each other. The bank BNL may induce the ink including the semiconductor element SE to be settled in a region of the non-display area NDA. Similarly to the protruding pattern BP, the bank BNL may include polyimide, but is not limited thereto.

The light emitting elements ED and the semiconductor elements SE may be disposed on the first insulating layer PAS1. The light emitting element ED may be disposed above the first electrode RME1 and the second electrode RME2 of each sub-pixel SPXn in the display area DPA, and the semiconductor element SE may be disposed above the third electrode RME3 and the fourth electrode RME4 in the non-display area NDA.

The light emitting elements ED may be disposed above the first electrode RME1 and the second electrode RME2 spaced apart from each other in the second direction DR2 between the protruding patterns BP. The light emitting elements ED may be disposed to be spaced apart from each other along the first direction DR1 in which the first electrode RME1 and the second electrode RME2 may extend, and may be substantially aligned parallel to each other. The light emitting element ED may have a shape extending in one direction, and its extension length may be greater than a distance between the first electrode RME1 and the second electrode RME2 spaced apart in the second direction DR2. The light emitting elements ED may be disposed such that ends thereof may be placed above the first electrode RME1 and the second electrode RME2, and the extension direction thereof may be substantially perpendicular to the extension direction of the first electrode RME1 and the second electrode RME2. However, the disclosure is not limited thereto, and a light emitting element ED may be disposed in a direction oblique to the extension direction of the first electrode RME1 and the second electrode RME2.

Similarly, the semiconductor elements SE may be disposed above the third electrode RME3 and the fourth electrode RME4 spaced apart from each other in the second direction DR2 in the non-display area NDA. The semiconductor elements SE may be disposed to be spaced apart from each other along the first direction DR1 and may be substantially aligned parallel to each other. The semiconductor element SE may also have a shape extending in a direction, and its extension length may be greater than a distance between the third electrode RME3 and the fourth electrode RME4 spaced apart in the second direction DR2. The semiconductor elements SE may be disposed such that ends thereof may be placed above the third electrode RME3 and the fourth electrode RME4.

The light emitting element ED may include layers arranged in a direction parallel to the top surface of the first substrate SUB. The light emitting element ED of the display device 10 may be disposed such that an extension direction thereof may be parallel to the first substrate SUB, and the semiconductor layers included in the light emitting element ED may be sequentially arranged in a direction parallel to the top surface of the first substrate SUB. However, the disclosure is not limited thereto. In some cases, in case that the light emitting element ED has a different structure, the layers may be arranged in a direction perpendicular to the first substrate SUB.

The light emitting elements ED disposed in each sub-pixel SPXn may emit light of different wavelength bands depending on a material constituting the semiconductor layer. However, the disclosure is not limited thereto, and the light emitting elements ED disposed in each sub-pixel SPXn may emit light of the same color. The light emitting element ED may include semiconductor layers doped with different conductivity types, and may be oriented such that one end of the light emitting element ED faces a specific direction by an electric field generated on the first electrode RME1 and the second electrode RME2.

The light emitting elements ED may include semiconductor layers, and a first end and a second end opposite thereto may be defined with respect to any one semiconductor layer. The light emitting element ED may be disposed such that the first end may be placed above the first electrode RME1 and the second end may be placed above the second electrode RME2. The first end of the light emitting element ED may be directed to the left side that may be another side in the second direction DR2.

The light emitting elements ED may be in contact with the first connection electrode CNE1 and the second connection electrode CNE2 to be electrically connected to the first electrode RME1 and the second electrode RME2. Since a part of the semiconductor layer may be exposed at the end surface of the light emitting element ED extending in a direction, the exposed semiconductor layer may be in contact with the connection electrode CNE. The light emitting elements ED may be electrically connected to the electrode RME or the conductive layers under the via layer VIA through the connection electrodes CNE, and may emit light of a specific wavelength band by receiving an electric signal.

On the other hand, the semiconductor element SE may be formed of a semiconductor layer. In an embodiment, the semiconductor element SE may be formed of a semiconductor layer of the same material as a first semiconductor layer 31 (see FIG. 7) included in the light emitting element ED. Unlike the light emitting element ED, a third end and a fourth end may be defined according to the type of the connection electrode CNE which may be in contact therewith. The semiconductor element SE may generate a current by an externally applied tension, and the generated electric energy may be utilized as a power source required in case that the light emitting element ED emits light.

The semiconductor elements SE may be in contact with the third and fourth connection electrodes CNE3 and CNE4 to be electrically connected to the third and fourth electrodes RME3 and RME4. The semiconductor elements SE may be electrically connected to the electrode RME or the conductive layers under the via layer VIA through the connection electrodes CNE, and may transmit the generated current.

A second insulating layer PAS2 may be disposed on the light emitting elements ED and the semiconductor elements SE. As one example, the second insulating layer PAS2 may be disposed to partially surround the outer surfaces of the light emitting elements ED and the semiconductor elements SE so as not to cover sides or ends of the light emitting elements ED or the semiconductor elements SE. A part of the second insulating layer PAS2 disposed on the light emitting element ED or the semiconductor element SE may be disposed to extend in the first direction DR1 in plan view to form a linear or isolated (e.g., island-like) pattern. The second insulating layer PAS2 may protect the light emitting elements ED and the semiconductor elements SE and may fix them in the fabricating process of the display device 10. Further, the second insulating layer PAS2 may be disposed to fill the space between the light emitting element ED or the semiconductor element SE and the first insulating layer PAS1 thereunder.

Furthermore, the second insulating layer PAS2 may also be disposed above the protruding pattern BP and on the bank BNL in the display area DPA. The second insulating layer PAS2 may be disposed on the first insulating layer PAS1 while exposing the sides of the light emitting element ED and partially exposing the portions where the electrodes RME may be disposed. The shape of the second insulating layer PAS2 may be formed through steps of disposing (e.g., entirely disposing) the second insulating layer PAS2 on the first insulating layer PAS1 and partially removing the second insulating layer PAS2 to expose the sides of the light emitting element ED, during the fabricating process of the display device 10.

The second insulating layer PAS2 may also be partially disposed in the sub-region SA. In a step of separating the electrode line after disposing the light emitting elements ED, the first insulating layer PAS1 and the second insulating layer PAS2 may be partially removed, and a part of the via layer VIA may be exposed in the separation portion ROP. A third insulating layer PAS3 may be disposed (e.g., directly disposed) on the exposed part of the via layer VIA.

The connection electrodes CNE (CNE1, CNE2, CNE3, and CNE4) and the third insulating layer PAS3 may be disposed on the second insulating layer PAS2.

The connection electrodes CNE may be disposed on the light emitting elements ED or the semiconductor elements SE, and the electrode RME. The connection electrodes CNE may be partially disposed on the second insulating layer PAS2 and may be insulated from each other by the second insulating layer PAS2 and the third insulating layer PAS3. The connection electrodes CNE may each be in contact with the light emitting elements ED or the semiconductor elements SE, and the electrodes RME.

Among the connection electrodes CNE, the first connection electrode CNE1 and the second connection electrode CNE2 may be disposed in the display area DPA. The first connection electrode CNE1 may have a shape extending in the first direction DR1 and may be disposed on the first electrode RME1. The first connection electrode CNE1 may be in contact with the first electrode RME1 through a first contact portion CT1 exposing the top surface of the first electrode RME1 and may be in contact with the first ends of the light emitting elements ED. The second connection electrode CNE2 may have a shape extending in the first direction DR1 and may be disposed on the second electrode RME2. The second connection electrode CNE2 may be in contact with the second electrode RME2 through a second contact portion CT2 exposing the top surface of the second electrode RME2 and may be in contact with the second ends of the light emitting elements ED. The first connection electrode CNE1 and the second connection electrode CNE2 may transmit an electric signal applied to the first electrode RME1 or the second electrode RME2 to one end of the light emitting element ED. The first connection electrode CNE1 and the second connection electrode CNE2 may be in contact (e.g., direct contact) with the semiconductor layers, respectively, exposed on end surfaces of the light emitting element ED.

The contact portions CT1 and CT2 may be disposed so as not to overlap the light emitting elements ED in the second direction DR2. For example, the contact portions CT1 and CT2 may be formed to be spaced apart from the area, in which the light emitting elements ED may be disposed, in the first direction DR1. In the drawing, it is illustrated that the contact portions CT1 and CT2 may be arranged in the sub-region SA, but the disclosure is not limited thereto, and the contact portions CT1 and CT2 may be formed in a portion where the light emitting elements ED may not be disposed in the emission area EMA.

Among the connection electrodes CNE, the third connection electrode CNE3 and the fourth connection electrode CNE4 may be disposed in the non-display area NDA. The third connection electrode CNE3 may have a shape extending in the first direction DR1, be disposed on the third electrode RME3, and be in contact (e.g., direct contact) with the third electrode RME3 and the semiconductor element SE. The fourth connection electrode CNE4 may have a shape extending in the first direction DR1, be disposed on the fourth electrode RME4, and be in contact (e.g., direct contact) with the fourth electrode RME4 and the semiconductor element SE. The third connection electrode CNE3 may be in contact with the third end of the semiconductor element SE, and the fourth connection electrode CNE4 may be in contact with the fourth end of the semiconductor element SE. Since the semiconductor element SE may be formed of one semiconductor layer, the third end and the fourth end of the semiconductor element SE may be distinguished according to the types of the connection electrodes CNE3 and CNE4 that may be in contact with them. The third connection electrode CNE3 and the fourth connection electrode CNE4 may transmit the current generated in the semiconductor element SE to the third electrode RME3 or the fourth electrode RME4.

Each of the connection electrodes CNE may be disposed to be spaced apart in the second direction DR2 in plan view. The first connection electrode CNE1 and the second connection electrode CNE2 may be spaced apart from each other by a distance so as not to be directly connected to each other. Similarly, the third connection electrode CNE3 and the fourth connection electrode CNE4 may be spaced apart from each other by a distance. The different connection electrodes CNE may not be connected to each other while being spaced apart from each other, and may be insulated from each other by the third insulating layer PAS3 disposed therebetween.

According to an embodiment, in the semiconductor element array SEA, one of the third connection electrode CNE3 and the fourth connection electrode CNE4 may be an ohmic contact electrode and the other may be a Schottky contact electrode. In the light emitting element array ELA, the first connection electrode CNE1 and the second connection electrode CNE2 may each be an ohmic contact electrode. The first connection electrode CNE1 and the second connection electrode CNE2 may be electrodes for transmitting an electric signal applied from the conductive layer of the circuit layer CCL to ends of the light emitting element ED, respectively, and may form an ohmic contact with the light emitting element ED, so that a current may flow in both directions.

As will be described later, the semiconductor element SE may have piezoelectric properties in which an energy band changes due to an external force, tension, or the like. In case that the energy band of the semiconductor element SE changes due to an external force, electrons move to maintain the equilibrium of the band, and power or the current generated by the movement of the electrons may be utilized in the light emission of the light emitting element array ELA.

In order to utilize the properties of the semiconductor element SE, the third connection electrode CNE3 and the fourth connection electrode CNE4 may have a connection through which the semiconductor element SE may generate a current based on its state. Since one of the third connection electrode CNE3 and the fourth connection electrode CNE4 forms a Schottky contact with the semiconductor element SE and the other forms an ohmic contact with the semiconductor element SE, the energy band of the semiconductor element SE may change due to an external force, thereby inducing a difference in electric potential. In addition to the piezoelectric properties of the semiconductor element SE, the semiconductor element SE may generate a current according to a connection manner of the third connection electrode CNE3 and the fourth connection electrode CNE4, and the current may flow only in one direction, e.g., toward a connection electrode forming an ohmic contact.

For example, in an embodiment in which the third connection electrode CNE3 forms a Schottky contact with the semiconductor element SE, and the fourth connection electrode CNE4 forms an ohmic contact with the semiconductor element SE, the current generated in the semiconductor element SE may flow to the fourth electrode RME4 and the fourth voltage wire VL4 through the fourth connection electrode CNE4, and the fourth voltage wire VL4 may be electrically connected to the light emitting element array ELA to provide power required in case that the light emitting element ED emits light.

The connection electrodes CNE may include a conductive material. For example, they may include ITO, IZO, ITZO, aluminum (Al), or the like, or a combination thereof. As an example, the connection electrodes CNE may include a transparent conductive material, and light emitted from the light emitting element ED may pass through the connection electrodes CNE and proceed toward the electrodes RME. However, the disclosure is not limited thereto.

The third insulating layer PAS3 may be disposed on the second connection electrode CNE2 or the fourth connection electrode CNE4, and the second insulating layer PAS2. The third insulating layer PAS3 may be disposed (e.g., entirely disposed) on the second insulating layer PAS2 to cover the second connection electrode CNE2 and the fourth connection electrode CNE4, and the first connection electrode CNE1 and the third connection electrode CNE3 may be disposed on the third insulating layer PAS3. The third insulating layer PAS3 may be disposed (e.g., entirely disposed) above the via layer VIA except for a region in which the first connection electrode CNE1 or the third connection electrode CNE3 may be disposed. The third insulating layer PAS3 may be disposed above the protruding pattern BP and the bank BNL in addition to the first insulating layer PAS1 and the second insulating layer PAS2. The third insulating layer PAS3 may insulate the first connection electrode CNE1 or the third connection electrode CNE3 from the second connection electrode CNE2 or the fourth connection electrode CNE4 so that they may not be in direct contact with each other.

In some embodiments, the third insulating layer PAS3 may be omitted in the display device 10. Accordingly, the connection electrodes CNE may be disposed (e.g., directly disposed) on the second insulating layer PAS2 to be on substantially the same layer.

Although not shown in the drawings, another insulating layer may be further disposed on the third insulating layer PAS3. The insulating layer may function to protect the members disposed on the first substrate SUB against the external environment.

Each of the first insulating layer PAS1, the second insulating layer PAS2 and the third insulating layer PAS3 described above may include an inorganic insulating material or an organic insulating material. However, the disclosure is not limited thereto.

Figure 7:
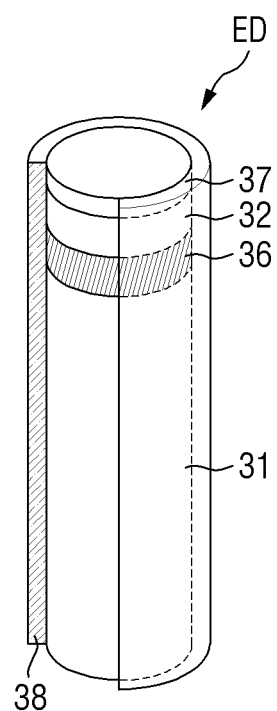
FIG. 7 is a schematic view of a light emitting element according to an embodiment.
Figure 8:
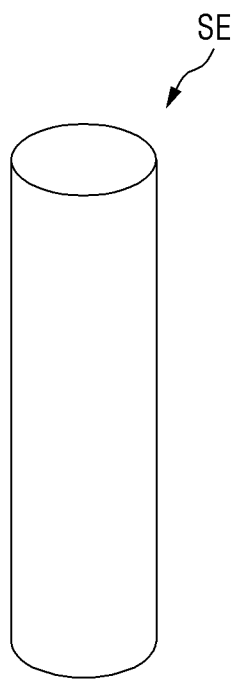
FIG. 8 is a schematic view of a semiconductor element according to an embodiment.

FIG. 7 is a schematic view of a light emitting element according to an embodiment. FIG. 8 is a schematic view of a semiconductor element according to an embodiment.

Referring to FIGS. 7 and 8, the light emitting element ED may be a light emitting diode, and the semiconductor element SE may be a semiconductor doped with polarity. The light emitting element ED may have a size of a nanometer to a micrometer and may be an inorganic light emitting diode made of an inorganic material. The light emitting element ED may be aligned between two electrodes having polarity in case that an electric field may be formed in a specific direction between two electrodes opposing each other. The semiconductor element SE may have a nanometer to micrometer size, and may be a semiconductor made of an inorganic material.

The light emitting element ED and the semiconductor element SE according to an embodiment may have a shape elongated in one direction. The light emitting element ED may have a shape of a cylinder, a rod, a wire, a tube, or the like. However, the shape of the light emitting element ED and the semiconductor element SE is not limited thereto, and the light emitting element ED may have a polygonal prism shape such as a regular cube, a rectangular parallelepiped and a hexagonal prism, or may have various shapes such as a shape elongated in one direction and having an outer surface partially inclined.

The light emitting element ED may include a semiconductor layer doped with any conductivity type (e.g., p-type or n-type) impurities. The semiconductor layer may emit light of a specific wavelength band by receiving an electric signal applied from an external power source. The light emitting element ED may include a first semiconductor layer 31, a second semiconductor layer 32, a light emitting layer 36, an electrode layer 37 and an insulating layer 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be any one or more of n-type doped AlGaInN, GaN, AlGaN, InGaN, AlN and InN. The n-type dopant doped into the first semiconductor layer 31 may be Si, Ge, Sn, or the like.

The second semiconductor layer 32 may be disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be any one or more of n-type doped AlGaInN, GaN, AlGaN, InGaN, AlN and InN. The p-type dopant doped into the second semiconductor layer 32 may be Mg, Zn, Ca, Se, Ba, or the like.

Although it is illustrated in the drawing that the first semiconductor layer 31 and the second semiconductor layer 32 may be configured as one layer, the disclosure is not limited thereto. Depending on the material of the light emitting layer 36, the first semiconductor layer 31 and the second semiconductor layer 32 may further include a larger number of layers, such as a cladding layer or a tensile strain barrier reducing (TSBR) layer.

The light emitting layer 36 may be disposed between the first semiconductor layer 31 and the second semiconductor layer 32. The light emitting layer 36 may include a material having a single or multiple quantum well structure. In case that the light emitting layer 36 includes a material having a multiple quantum well structure, quantum layers and well layers may be stacked alternately. The light emitting layer 36 may emit light by coupling of electron-hole pairs according to an electric signal applied through the first semiconductor layer 31 and the second semiconductor layer 32. The light emitting layer 36 may include a material such as AlGaN or AlGaInN. In particular, in case that the light emitting layer 36 has a structure in which quantum layers and well layers may be alternately stacked in a multiple quantum well structure, the quantum layer may include a material such as AlGaN or AlGaInN, and the well layer may include a material such as GaN or AlInN.

The light emitting layer 36 may have a structure in which semiconductor materials having large band gap energy and semiconductor materials having small band gap energy may be alternately stacked on each other, and may include other group III to V semiconductor materials according to the wavelength band of the emitted light. The light emitted by the light emitting layer 36 is not limited to light of a blue wavelength band, but the active layer 36 may also emit light of, e.g., a red or green wavelength band in some cases.

The electrode layer 37 may be an ohmic connection electrode. However, the disclosure is not limited thereto, and it may be a Schottky connection electrode. The light emitting element ED may include at least one electrode layer 37. The light emitting element ED may include one or more electrode layers 37, but the disclosure is not limited thereto, and the electrode layer 37 may be omitted.

In the display device 10, in case that the light emitting element ED may be electrically connected to an electrode or a connection electrode, the electrode layer 37 may reduce the resistance between the light emitting element ED and the electrode or connection electrode. The electrode layer 37 may include conductive metal. For example, the electrode layer 370 may include at least one of aluminum (Al), titanium (Ti), indium (In), gold (Au), silver (Ag), ITO, IZO, or ITZO.

The insulating layer 38 may be arranged to surround the outer surfaces of the semiconductor layers and electrode layers described above. For example, the insulating layer 38 may be disposed to surround at least the outer surface of the light emitting layer 36, and may be formed to expose ends of the light emitting element ED in the longitudinal direction. Further, in cross-sectional view, the insulating layer 38 may have a top surface, which may be rounded in a region adjacent to at least one end of the light emitting element ED.

The insulating layer 38 may include a material having insulating properties, such as silicon oxide (SiOx), silicon nitride (SiNx), silicon oxynitride (SiOxNy), aluminum nitride (AlNx), aluminum oxide (AlOx), or a combination thereof. It is illustrated in the drawing that the insulating layer 38 may be formed as a single layer, but the disclosure is not limited thereto. In some embodiments, the insulating layer 38 may be formed in a multilayer structure having layers that may be stacked on each other therein.

The insulating layer 38 may function to protect the members. The insulating layer 38 may prevent an electrical short circuit that may be likely to occur at the light emitting layer 36 in case that an electrode to which an electric signal may be transmitted may be in direct contact with the light emitting element ED. The insulating layer 38 may prevent a decrease in light emission efficiency of the light emitting element ED.

Further, the insulating layer 38 may have an outer surface which may be surface-treated. The light emitting elements ED may be aligned in such a way of spraying the ink in which the light emitting elements ED may be dispersed on the electrodes. Here, the surface of the insulating layer 38 may be treated in a hydrophobic or hydrophilic manner in order to keep the light emitting elements ED in a dispersed state without aggregation with other light emitting elements ED adjacent in the ink.

According to an embodiment, the semiconductor element SE may be made of the same material as the first semiconductor layer 31 of the light emitting element ED. The semiconductor element SE may be an n-type semiconductor. For example, the semiconductor element SE may be any one or more of n-type doped AlGaInN, GaN, AlGaN, InGaN, AlN, and InN. The n-type dopant doped into the semiconductor element SE may be Si, Ge, Sn, or the like. As one example, the semiconductor element SE and the first semiconductor layer 31 of the light emitting element ED may be n-type doped GaN (or n-GaN).

The light emitting element ED may include the light emitting layer 36 disposed between the first semiconductor layer 31 and the second semiconductor layer 32, and may emit light of a specific wavelength band through the current flowing in the first and second connection electrodes CNE1 and CNE2 which may be in ohmic contact. On the other hand, the semiconductor element SE may be made of a semiconductor of the same material as the first semiconductor layer 31 of the light emitting element ED, but may be a non-light emitting semiconductor element that does not include the light emitting layer 36. Since the semiconductor element SE may be made of a material such as n-GaN, it may have piezoelectric properties to generate a current while its shape or state changes due to an external force.

The energy band of the semiconductor element SE may change while the shape of the semiconductor element SE changes due to an external force, tension, or the like. Ends of the semiconductor element SE may be in contact with the connection electrodes CNE3 and CNE4 forming Schottky and ohmic contacts, respectively, and an electric potential difference may occur as the energy band changes. In case that electrons in the semiconductor element SE move to maintain equilibrium in the electric potential difference and the changed energy band, a current may be generated, and the current may flow only through a connection electrode, e.g., the fourth connection electrode CNE4, forming an ohmic contact, and may not flow through the third connection electrode CNE3 forming a Schottky contact. The semiconductor element array SEA may generate a current by including the semiconductor element SE having piezoelectric properties, and the third and fourth connection electrodes CNE3 and CNE4 forming a Schottky/ohmic contact, and the current may be used as a power source required for light emission of the light emitting element array ELA.

Figure 9:
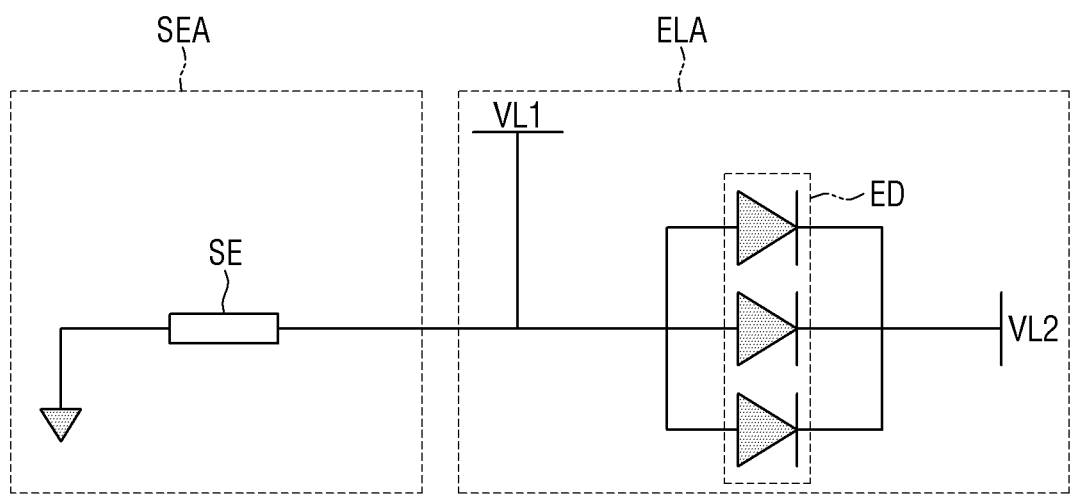
FIG. 9 is a schematic circuit diagram illustrating a connection between a semiconductor element array and a light emitting element array in a display device according to an embodiment.

FIG. 9 is a schematic circuit diagram illustrating a connection between a semiconductor element array and a light emitting element array in a display device according to an embodiment.

Referring to FIG. 9, the light emitting element array ELA may include the light emitting elements ED, and the first and second voltage wires VL1 and VL2 electrically connected thereto. Although not shown in FIG. 9, the light emitting element array ELA of each sub-pixel SPXn may include the first transistor T1 connected to the light emitting element ED, and may further include other transistors and a capacitor.

In the light emitting element array ELA, power may be applied to the first voltage wire VL1 and the second voltage wire VL2, and the light emitting elements ED may emit light according to the operation of the transistors connected to the light emitting elements ED. Among them, the first voltage wire VL1 may be connected to the power supply device included in the display device 10, and power for light emission of the light emitting element ED may be applied from the power supply device.

In the semiconductor element array SEA, the fourth end, which may be one of the ends of the semiconductor element SE, connected in ohmic contact may be electrically connected to the fourth voltage wire VL4. In case that a current is generated in the semiconductor element SE, the current may flow to the fourth voltage wire VL4 through the fourth connection electrode CNE4 and the fourth electrode RME4. In an embodiment, the fourth voltage wire VL4 may be electrically connected to the first voltage wire VL1, and the current generated in the semiconductor element SE may be used as a power source for light emission of the light emitting element ED in the light emitting element array ELA.

In the semiconductor element SE in a state in which no external force or tension may be applied, there may be no change in the energy band, and thus no current may be generated. In case that a user applies pressure to the non-display area NDA while using the display device 10, a current may be generated in the semiconductor element SE while an external force may be applied to the semiconductor element array SEA. In other embodiments, such as an embodiment in which the display device 10 may be a foldable display device, in case that the user folds/unfolds the non-display area NDA of the display device 10, a tension may be applied to the semiconductor element array SEA, and a current may be generated in the semiconductor element SE.

The display device 10 according to an embodiment may additionally generate power required during the use of the display device 10 by including the semiconductor element array SEA including the semiconductor element SE having piezoelectric properties. The semiconductor element array SEA may provide a power source required for the light emitting element ED to emit light in the light emitting element array ELA, and may have an advantage of reducing power consumed in the power supply device included in the display device 10.

As described above, the light emitting element array ELA and the semiconductor element array SEA may each include the electrode RME disposed in the same layer on the via layer VIA. The light emitting element array ELA and the semiconductor element array SEA may include the light emitting element ED and the semiconductor element SE having a similar structure, respectively, and include the connection electrodes CNE arranged in the same structure. In the fabricating process of the display device 10, the semiconductor element array SEA and the light emitting element array ELA may be formed substantially at the same time. The electrodes RME may be formed in a pattern on the surface (e.g., entire surface) of the display device 10, and may be divided into the electrodes RME (RME1 and RME2) of the light emitting element array ELA or the electrodes RME (RME3 and RME4) of the semiconductor element array SEA according to the arrangement position.

Figure 10:
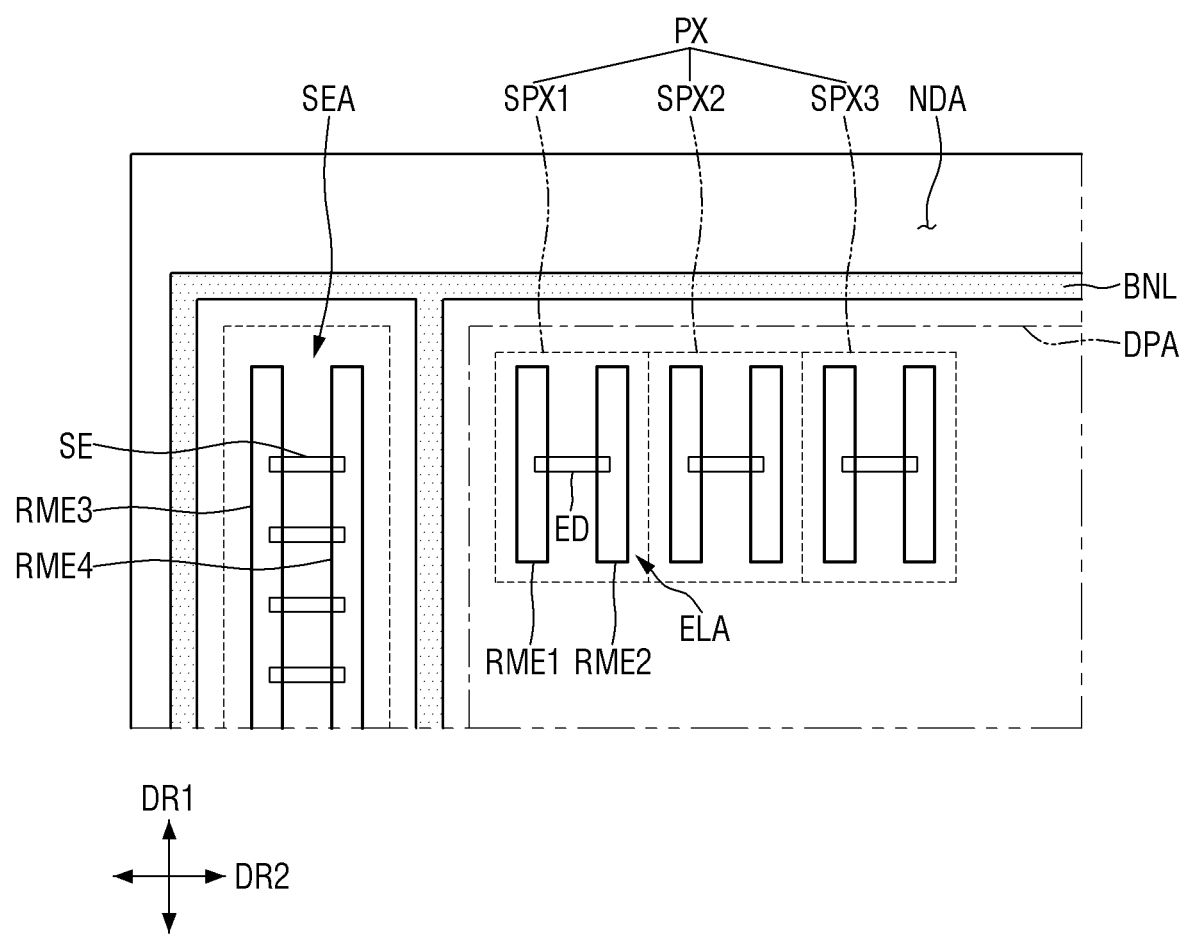
FIG. 10 is a schematic plan view illustrating the arrangement of electrodes of a light emitting element array and a semiconductor element array in a display device according to an embodiment.

FIG. 10 is a schematic plan view illustrating the arrangement of electrodes of a light emitting element array and a semiconductor element array in a display device according to an embodiment.

Referring to FIG. 10, in the display device 10 according to an embodiment, the first electrode RME1 and the second electrode RME2 of the light emitting element array ELA may have a shape extending in the first direction DR1, and the third electrode RME3 and the fourth electrode RME4 of the semiconductor element array SEA may also extend in the first direction DR1.

In the display area DPA, the sub-pixels SPXn may be arranged in the first direction DR1 and the second direction DR2, and in the sub-pixels SPXn arranged in the first direction DR1, the first electrode RME1 and the second electrode RME2 of the light emitting element array ELA may be disposed in parallel to each other in the first direction DR1. The sub-pixels SPXn arranged in the first direction DR1 may share one electrode line, and after the light emitting elements ED may be aligned, the electrode line may be separated to form an electrode of each sub-pixel SPXn. In contrast, the semiconductor element array SEA in the non-display area NDA includes a third electrode RME3 and fourth electrode RME4 extending in the first direction DR1. The third electrode RME3 and the fourth electrode RME4 included in the semiconductor element array SEA may have substantially the same shape as an electrode line derived from the electrodes RME arranged in the light emitting element array ELA of the display area DPA.

In an embodiment in which the semiconductor element array SEA may be disposed in the non-display area NDA on both sides of the display device 10 in the second direction DR2, a region where the first electrode RME1 and the second electrode RME2 may be disposed may be spaced apart in the second direction DR2 from a region where the third electrode RME3 and the fourth electrode RME4 may be disposed. The light emitting element arrays ELA of the display area DPA and the semiconductor element array SEA of the non-display area NDA may be spaced apart from each other in the second direction DR2, which may be a direction perpendicular to the extension direction of the electrodes RME. The electrodes RME of the light emitting element arrays ELA and the semiconductor element array SEA may extend in the first direction DR1, be disposed parallel to each other, and be spaced apart from each other in the second direction DR2.

However, in some embodiments, the electrodes RME may extend in the second direction DR2. In an embodiment in which the semiconductor element array SEA may be disposed in the non-display area NDA on both sides of the display device 10 in the second direction DR2, if the electrodes RME extend in the second direction DR2, the electrodes RME of the light emitting element arrays ELA and the semiconductor element array SEA may have a different arrangement relationship from that of the embodiment of FIG. 10.

Figure 11:
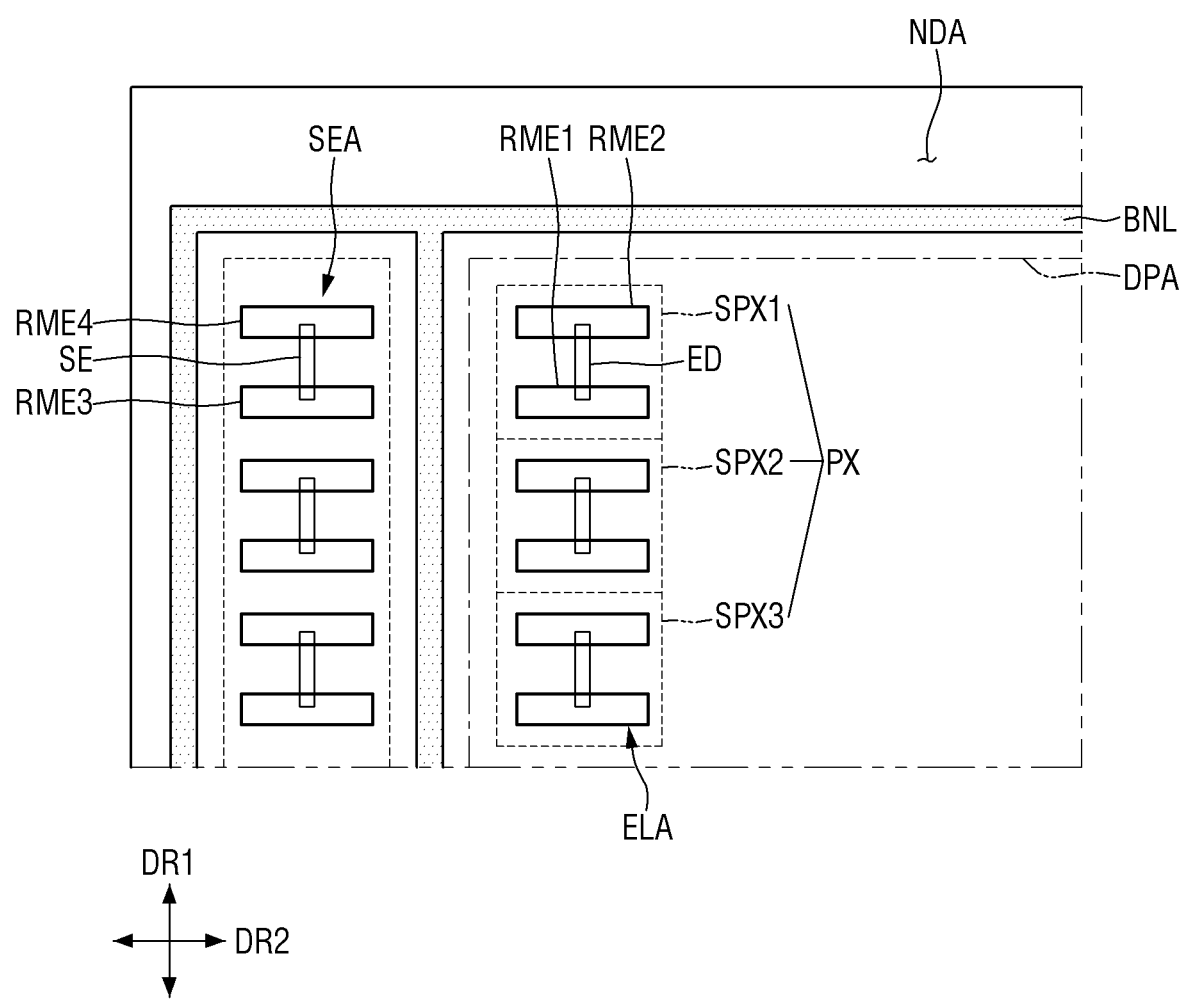
FIG. 11 is a schematic plan view illustrating the arrangement of electrodes of a light emitting element array and a semiconductor element array in a display device according to another embodiment.

FIG. 11 is a schematic plan view illustrating the arrangement of electrodes of a light emitting element array and a semiconductor element array in a display device according to another embodiment.

Referring to FIG. 11 in addition to FIG. 10, in the display device 10 according to an embodiment, the first electrode RME1 and the second electrode RME2 of the light emitting element array ELA may have a shape extending in the second direction DR2, and the third electrode RME3 and the fourth electrode RME4 of the semiconductor element array SEA may also extend in the second direction DR2. The light emitting element arrays ELA of the display area DPA and the semiconductor element array SEA of the non-display area NDA may be spaced apart from each other in the second direction DR2, which may be the same direction as the extension direction of the electrodes RME. The electrodes RME of the light emitting element arrays ELA and the semiconductor element array SEA may extend in the second direction DR2, and the first electrode RME1 and the second electrode RME2 may be spaced apart from the third electrode RME3 and the fourth electrode RME4, respectively, in the second direction DR2. However, unlike the embodiment of FIG. 10, the first electrode RME1 and the third electrode RME3 may be arranged parallel to the second electrode RME2 and the fourth electrode RME4, respectively, in the second direction DR2. In the fabricating process of the display device 10, the first and third electrodes RME1 and RME3, and the second and fourth electrodes RME2 and RME4 may be formed as one electrode line, and may be separated in the sub-region SA of each sub-pixel SPXn.

The light emitting element array ELA and the semiconductor element array SEA may differ from each other only in whether the protruding pattern BP may be disposed and whether the light emitting element ED and the semiconductor element SE may be disposed, but may be identical to each other in the relative arrangement of the electrodes RME and the connection electrodes CNE electrically connected to the light emitting element ED or the semiconductor element SE. In particular, since the electrodes RME of each array may include the same material and may be formed at the same time, in the display device 10, the arrangement relationship between the light emitting element array ELA and the semiconductor element array SEA and the arrangement relationship between the electrodes RME may be variously modified.

Hereinafter, other embodiments of the display device 10 will be described with reference to other drawings.

Figure 12:
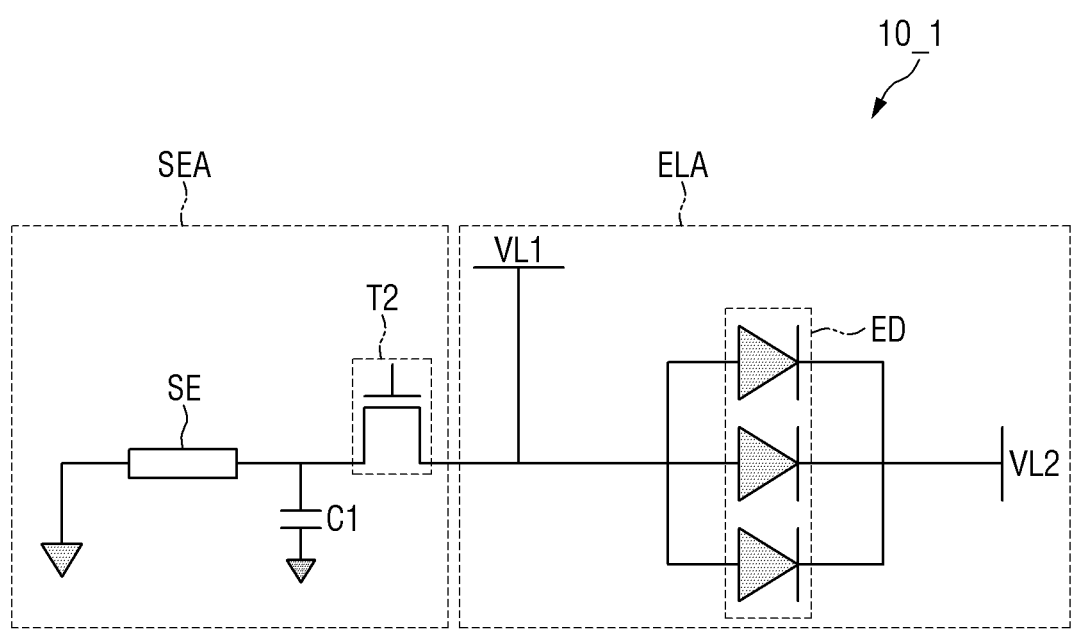
FIG. 12 is a schematic circuit diagram illustrating a connection between a semiconductor element array and a light emitting element array in a display device according to another embodiment.

FIG. 12 is a schematic circuit diagram illustrating a connection between a semiconductor element array and a light emitting element array in a display device according to another embodiment.

Referring to FIG. 12, in a display device 10_1 according to an embodiment, the semiconductor element array SEA may further include a second transistor T2 and a first capacitor C1. A current generated in the semiconductor element SE may flow to the fourth electrode RME4 through the fourth connection electrode CNE4 forming an ohmic contact. The fourth electrode RME4 may be connected to the first capacitor C1, and the current may be stored in the first capacitor C1. The second transistor T2 connected to the first capacitor C1 may be selectively turned on according to a signal applied to the gate electrode, and, if necessary, the current stored in the first capacitor C1 may be provided in case that the light emitting element array ELA emits light. In the display device 10_1, as the semiconductor element array SEA may further include the second transistor T2 and the first capacitor C1 in addition to the semiconductor element SE, the generated current may be selectively used as needed. Therefore, there may be an advantage in that the power consumption may be more efficiently reduced.

Figure 13:
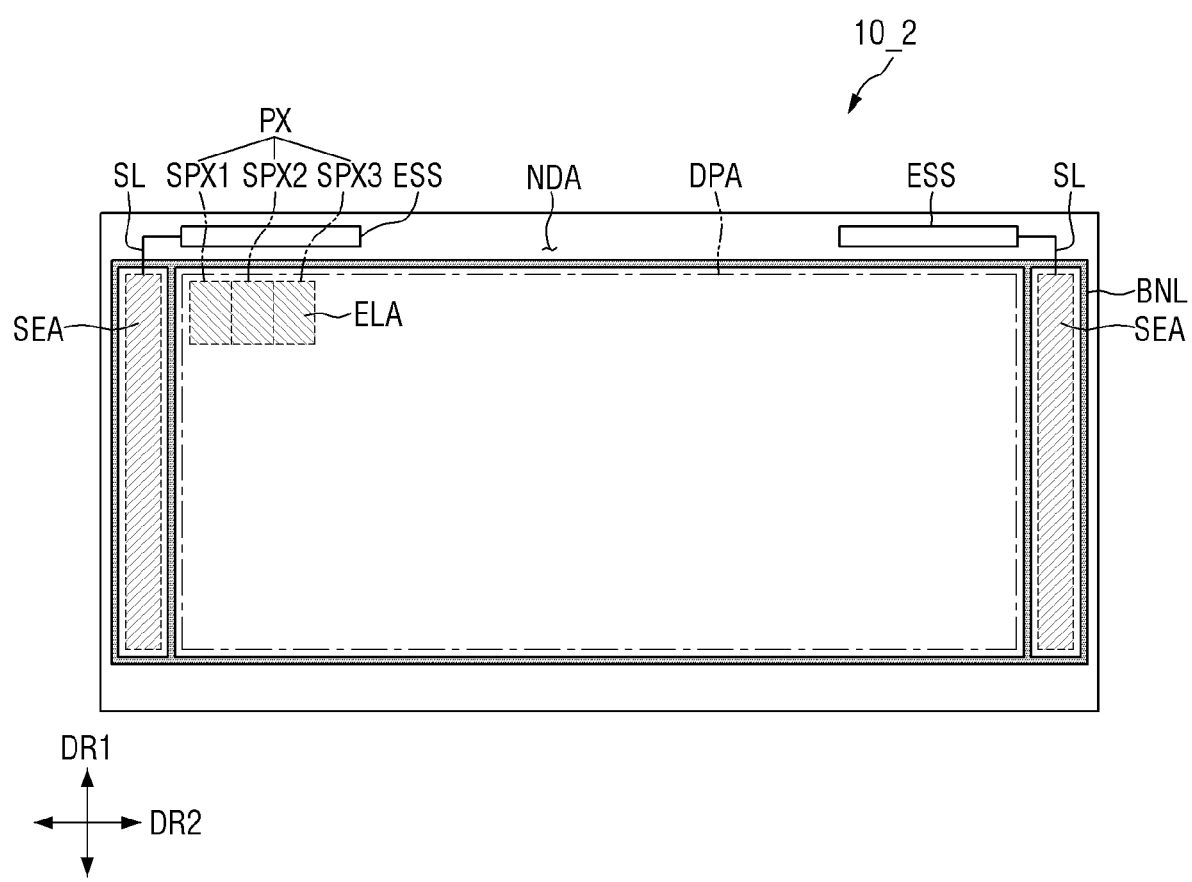
FIG. 13 is a schematic view illustrating a display area and a non-display area of a display device according to an embodiment.
Figure 14:
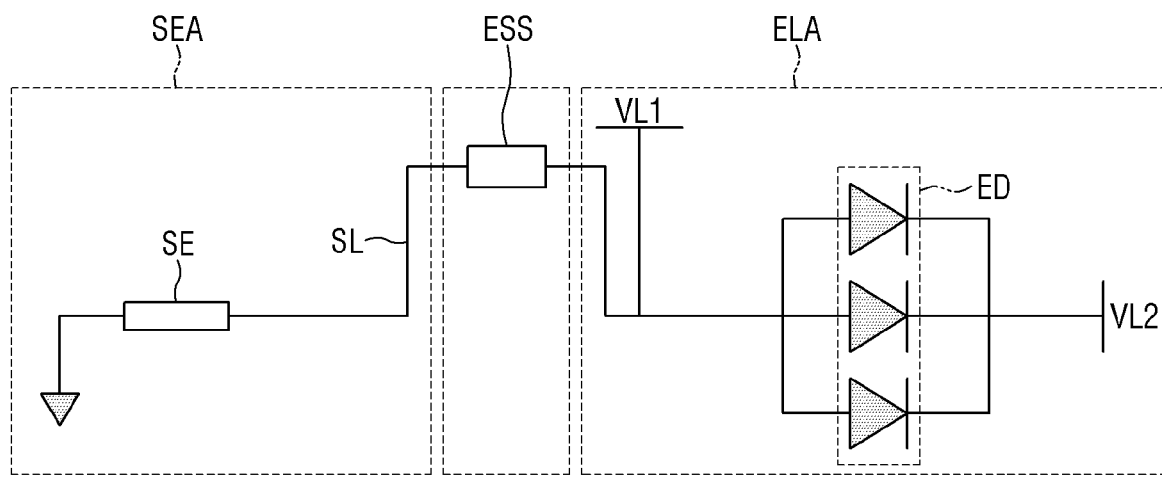
FIG. 14 is a schematic circuit diagram illustrating a connection between a semiconductor element array and a light emitting element array in the display device of FIG. 13.

FIG. 13 is a schematic view illustrating a display area and a non-display area of a display device according to an embodiment. FIG. 14 is a schematic circuit diagram illustrating a connection between a semiconductor element array and a light emitting element array in the display device of FIG. 13.

Referring to FIGS. 13 and 14, a display device 10_2 according to an embodiment may further include a power storage device ESS disposed in the non-display area NDA. Similarly to the embodiment of FIG. 12, the display device 10_2 may further include the power storage device ESS to use power generated in the semiconductor element array SEA as needed.

In an embodiment in which the semiconductor element array SEA may be disposed in the non-display area NDA on both sides of the display device 10_2 in the second direction DR2, the display device 10_2 may include power storage devices ESS corresponding to each semiconductor element array SEA. The power storage device ESS may be disposed in the non-display area NDA on one side of the display area DPA in the first direction DR1. One power storage device ESS may be disposed adjacent to one side in the second direction DR2, and another power storage device ESS may be disposed adjacent to the other side in the second direction DR2. In the drawing, it is illustrated that two power storage devices ESS may be arranged, but this may vary depending on the number and arrangement of the semiconductor element arrays SEA.

Each power storage device ESS may be electrically connected to the semiconductor element array SEA through a sub-wire SL. The sub-wire SL may be connected to the power storage device ESS and the fourth voltage wire VL4 connected to the semiconductor element array SEA. The power storage device ESS may be connected to the first voltage wire VL1 connected to the light emitting element array ELA through another wire.

In the semiconductor element array SEA, a current generated in the semiconductor element SE may flow through the fourth connection electrode CNE4 forming an ohmic contact, and the current may flow to the power storage device ESS through the fourth electrode RME4, the fourth voltage wire VL4, and the sub-wire SL. The power storage device ESS may store the current generated in the semiconductor element array SEA, and may provide it to the light emitting element array ELA as needed. The display device 10_2 may selectively use the generated current as needed by further including the power storage device ESS that can store power produced in the semiconductor element array SEA. Accordingly, there may be an advantage in that the power consumption may be more efficiently reduced.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:
1. A display device comprising:
a first electrode disposed on a substrate;
a second electrode disposed on the substrate and spaced apart from the first electrode;

light emitting elements having ends disposed on the first electrode and the second electrode;
a third electrode disposed on the substrate;
a fourth electrode disposed on the substrate and spaced apart from the third electrode;
semiconductor elements having ends disposed on the third electrode and the fourth electrode;
a third connection electrode disposed on the third electrode and in contact with an end of each of the semiconductor elements; and
a fourth connection electrode disposed on the fourth electrode and in contact with another end of each of the semiconductor elements, wherein
the light emitting elements each include a first semiconductor layer, a second semiconductor layer, and a light emitting layer disposed between the first semiconductor layer and the second semiconductor layer, and
an entirety of the semiconductor elements including the end of each of the semiconductor elements and the another end of each of the semiconductor elements is made of a same material as the first semiconductor layer of the light emitting elements.

2. The display device of claim 1, further comprising:
a first connection electrode disposed on the first electrode and in contact with an end of each of the light emitting elements; and
a second connection electrode disposed on the second electrode and in contact with another end of each of the light emitting elements.

3. The display device of claim 2, wherein
the third connection electrode forms a Schottky contact with each of the semiconductor elements, and
the fourth connection electrode forms an ohmic contact with each of the semiconductor elements.

4. The display device of claim 3, wherein each of the first connection electrode and the second connection electrode forms an ohmic contact with each of the light emitting elements.

5. The display device of claim 1, further comprising:
a via layer disposed between the substrate and the electrodes; and
voltage wires disposed between the via layer and the substrate,
wherein the voltage wires include:
a first voltage wire electrically connected to the first electrode;
a second voltage wire electrically connected to the second electrode;
a third voltage wire electrically connected to the third electrode; and
a fourth voltage wire electrically connected to the fourth electrode.

6. The display device of claim 5, wherein the fourth voltage wire is electrically connected to the first voltage wire.

7. The display device of claim 5, wherein
the first electrode is electrically connected to the first voltage wire through a first transistor disposed between the via layer and the substrate, and
the second electrode contacts the second voltage wire through a contact hole penetrating the via layer.

8. The display device of claim 7, wherein
the third electrode contacts the third voltage wire through a contact hole penetrating the via layer, and
the fourth electrode contacts the fourth voltage wire through a contact hole penetrating the via layer.

9. The display device of claim 7, wherein
the third electrode contacts the third voltage wire through a contact hole penetrating the via layer, and
the fourth electrode is electrically connected to the fourth voltage wire through a first capacitor and a second transistor electrically connected to the first capacitor.

10. The display device of claim 5, wherein the fourth voltage wire is electrically connected to a power storage device electrically connected to the first voltage wire.

11. The display device of claim 1, further comprising a bank surrounding a region where the first electrode and the second electrode are disposed, and a region where the third electrode and the fourth electrode are disposed.

12. The display device of claim 11, further comprising protruding patterns disposed between the substrate and the first electrode, and between the substrate and the second electrode.

13. The display device of claim 11, wherein
each of the first electrode and the second electrode extends in a first direction,
each of the third electrode and the fourth electrode extends in the first direction, and
among regions surrounded by the bank, the region where the first electrode and the second electrode are disposed is spaced apart in a second direction intersecting the first direction from the region where the third electrode and the fourth electrode are disposed.

14. The display device of claim 11, wherein
each of the first electrode and the second electrode extends in a second direction,
each of the third electrode and the fourth electrode extends in the second direction, and
the region where the first electrode and the second electrode are disposed is spaced apart in the second direction from the region where the third electrode and the fourth electrode are disposed.

15. The display device of claim 14, wherein
the first electrode and the third electrode are disposed parallel to each other in the second direction, and
the second electrode and the fourth electrode are disposed parallel to each other in the second direction.

* * * * *